US012780969B2

(12) United States Patent
Ng

(10) Patent No.: US 12,780,969 B2
(45) Date of Patent: Nov. 3, 2026

(54) DEVELOPMENT OF NOVEL HYDROPHILIC PINNING MAT

(71) Applicant: Merck Patent GmbH, Darmstadt (DE)

(72) Inventor: Edward W. Ng, Belle Mead, NJ (US)

(73) Assignee: Merck Patent GmbH, Darmstadt (DE)

( * ) Notice: Subject to any disclaimer, the term of this patent is extended or adjusted under 35 U.S.C. 154(b) by 482 days.

(21) Appl. No.: 18/292,540

(22) PCT Filed: Aug. 16, 2022

(86) PCT No.: PCT/EP2022/072817
§ 371 (c)(1),
(2) Date: Jan. 26, 2024

(87) PCT Pub. No.: WO2023/021016
PCT Pub. Date: Feb. 23, 2023

(65) Prior Publication Data

US 2024/0336716 A1 Oct. 10, 2024

Related U.S. Application Data

(60) Provisional application No. 63/234,301, filed on Aug. 18, 2021.

(51) Int. Cl.
*C08F 220/14* (2006.01)
*G03F 7/16* (2006.01)

(52) U.S. Cl.
CPC ............ *C08F 220/14* (2013.01); *G03F 7/168* (2013.01)

(58) Field of Classification Search
CPC ........ C08F 220/14; C08F 8/00; C08F 265/04; C08F 2810/20; C08F 220/1818;
(Continued)

(56) References Cited

U.S. PATENT DOCUMENTS 5,658,988 A 8/1997 Ogino
6,420,441 B1 7/2002 Allen
(Continued)

FOREIGN PATENT DOCUMENTS

EP 2949702 A1 12/2015
JP 2000129200 A 5/2000
(Continued)

OTHER PUBLICATIONS

A Deiter Shluter et al_Synthesis of Polymers, 2014_vol. 1_p. 315.
(Continued)

*Primary Examiner* — Caleen O Sullivan
(74) *Attorney, Agent, or Firm* — EMD Performance Materials Corp.

(57) ABSTRACT

The invention relates to a random copolymers which comprise a repeat unit of structure (I) and at least one other type of repeat unit of structure (A), structure (A) comprising: an alkyl bearing repeat units of structure (I), Formula (I), a trialkylsilyloxy bearing repeat units of structure (II), Formula (II), at least one type of crosslinking repeat units of structure (III), Formula (III), and compositions comprising this random copolymer and other compositions which comprise a random copolymer which has a repeat unit of structure (I), Formula (I) and at least one other repeat unit derived from an alkyl 2-methylenealkanoate or a or an alkyl methacrylate, wherein said alkyloxy moiety is substituted with a crosslinking functionality selected from a trialkylsilyloxy, an oxirane, a trialkyloxysilyl, and an anthracene which are free of a thermal acid generator, photoacid generator, thermal radical generator, or photo-radical generator and the process of producing hydrophilic MAT coatings from these compostions for use in directed self-assembly processing.

20 Claims, 2 Drawing Sheets

(58) Field of Classification Search

Figure 1:
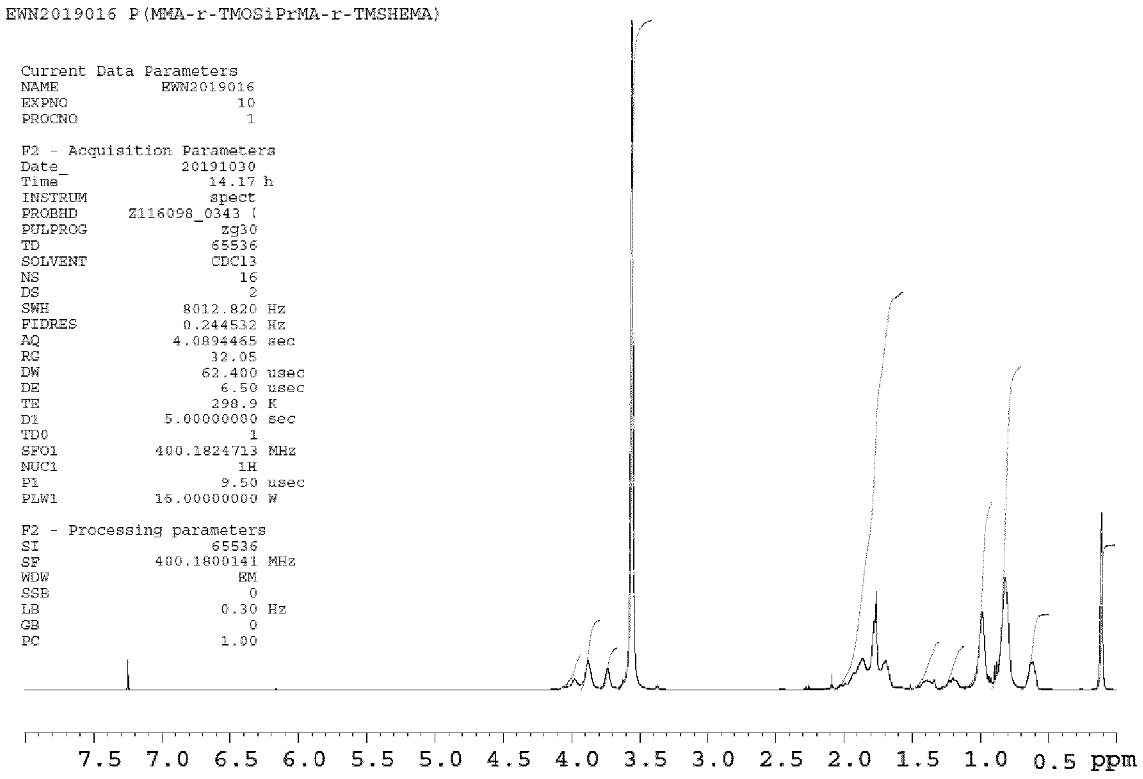

CPC .............. C08F 220/325; C08F 222/402; C08F 230/085; G03F 7/168; G03F 7/0002; C09D 143/04; C09D 4/06

USPC ................................................ 430/325, 270.1

See application file for complete search history.

(56) References Cited

U.S. PATENT DOCUMENTS

| | | | | |
|---|---|---|---|---|
| 9,093,263 | B2 | 7/2015 | Wu | |
| 9,490,117 | B2 | 11/2016 | Park | |
| 2006/0046069 | A1 | 3/2006 | Jung | |
| 2013/0157196 | A1 | 6/2013 | Nakasugi | |
| 2014/0234589 | A1* | 8/2014 | Koh | G03F 7/0002 427/510 |
| 2014/0273511 | A1 | 9/2014 | Farrell | |
| 2016/0251539 | A1 | 9/2016 | Hustad | |
| 2017/0114246 | A1* | 4/2017 | Arellano | B32B 27/08 |
| 2021/0230339 | A1* | 7/2021 | Ng | C08F 220/14 |
| 2022/0389135 | A1* | 12/2022 | Baskaran | C08F 112/08 |
| 2025/0034306 | A1* | 1/2025 | Ng | C08F 212/08 |

FOREIGN PATENT DOCUMENTS

| | | | |
|---|---|---|---|
| JP | 2019116614 | A | 7/2019 |
| WO | 2023021016 | A2 | 2/2023 |
| WO | 2023021016 | A3 | 4/2023 |

OTHER PUBLICATIONS

Carmen M González-Henríquez et al_Molecules 2019, 24, 751.

Encyclopedia of Polymer Science and Technology_2014_7_625.

Xiaofeng Guo_etal_Macromolecular rapid communications_2018_39_20_1800479.

Yuanyuan Pang et al_Macromolecules_2019_52_2987-2994.

PCT International Search Report and Written Opinion, PCT/EP2022/072817, mail date Mar. 20, 2023.

* cited by examiner

DEVELOPMENT OF NOVEL HYDROPHILIC PINNING MAT

This application is a national stage application, filed under 35 U.S.C. § 371, of International Patent Application No PCT/EP2022/072817, filed on 16 Aug. 2022, which claims the benefit of U.S. Provisional Patent Application No. 63/234,301, filed 18 Aug. 2021, each of which applications is incorporated herein by reference in their entirety.

FIELD OF THE INVENTION

The invention relates to polar pinning MAT composition for use in directed self-assembly processing.

BACKGROUND

Self-assembly of block copolymers is a method useful for generating smaller and smaller patterned features for the manufacture of microelectronic devices in which the critical dimensions (CD) of features on the order of nanoscale can be achieved. Self-assembly methods are desirable for extending the resolution capabilities of microlithographic technology for repeating features such as an array of contact holes or posts. In a conventional lithography approach, ultraviolet (UV) radiation may be used to expose through a mask onto a photoresist layer coated on a substrate or layered substrate. Positive or negative photoresists are useful, and these can also contain a refractory element such as silicon to enable dry development with conventional integrated circuit (IC) plasma processing. In a positive photoresist, UV radiation transmitted through a mask causes a photochemical reaction in the photoresist such that the exposed regions are removed with a developer solution or by conventional IC plasma processing. Conversely, in negative photoresists, UV radiation transmitted through a mask causes the regions exposed to radiation to become less removable with a developer solution or by conventional IC plasma processing. An integrated circuit feature, such as a gate, via or interconnect, is then etched into the substrate or layered substrate, and the remaining photoresist is removed. When using conventional lithographic exposure processes, the dimensions of features of the integrated circuit feature are limited. Further reduction in pattern dimensions are difficult to achieve with radiation exposure due to limitations related to aberrations, focus, proximity effects, minimum achievable exposure wavelengths and maximum achievable numerical apertures. The need for large-scale integration has led to a continued shrinking of the circuit dimensions and features in the devices. In the past, the final resolution of the features has been dependent upon the wavelength of light used to expose the photoresist, which has its own limitations. Directed (a.k.a. guided) self-assembly techniques, such as graphoepitaxy and chemoepitaxy using block copolymer imaging, which employ a patterned area on a substrate, are highly desirable techniques used to enhance resolution while reducing CD variation. These techniques can be employed to either enhance conventional UV lithographic techniques or to enable even higher resolution and CD control in approaches employing EUV, e-beam, deep UV or immersion lithography. The directed self-assembly (DSA) block copolymer comprises a block of etch resistant copolymeric unit and a block of highly etchable copolymeric unit, which when coated, aligned and etched on a substrate give regions of very high-density patterns.

For directed (guided), or unguided self-assembly, of a block copolymer film, respectively, on a patterned or nonpatterned substrate area, typically the self-assembly process of this block polymer layer occurs during annealing of this film overlying a neutral layer. This neutral layer over a semiconductor substrate may be an unpatterned neutral layer, or in chemoepitaxy or graphoepitaxy, this neutral layer may contain, respectively, graphoepitaxy or chemoepitaxy guiding features (formed through the above described UV lithographic technique). During annealing of the block copolymer film, the underlying, neutral layer, directs the nanophase separation of the block copolymer domains. One example is the formation phase separated domains which are lamellas or cylinders perpendicular to the underlying neutral layer surface. These nanophase separated block copolymer domains form a pre-pattern (e.g., line and space L/S) which may be transferred into the substrate through an etching process (e.g., plasma etching). In graphoepitaxy, or in chemoepitaxy, these guiding features may dictate both pattern rectification and pattern rectification. In the case of an unpatterned neutral layer this produces a repeating array of for instance L/S or CH. For example, in a conventional block copolymer such as poly(styrene-b-methyl methacrylate (P(S-b-MMA)), in which both blocks have similar surface energies at the BCP-air interface, this can be achieved by coating and thermally annealing the block copolymer on a layer of non-preferential or neutral material that is grafted or cross-linked at the polymer-substrate interface.

In the graphoepitaxy directed self-assembly method, the block copolymers self organizes around a substrate that is pre-patterned with conventional lithography (Ultraviolet, Deep UV, e-beam, Extreme UV (EUV) exposure source) to form repeating topographical features such as a line/space (L/S) or contact hole (CH) pattern. In an example of a L/S directed self-assembly array, the block copolymer can form self-aligned lamellar regions which can form parallel line-space patterns of different pitches in the trenches between pre-patterned lines, thus enhancing pattern resolution by subdividing the space in the trench between the topographical lines into finer patterns. For example, a diblock copolymer or a triblock copolymer which is capable of microphase separation and comprises a block rich in carbon (such as styrene or containing some other element like Si, Ge, Ti) which is resistant to plasma etch, and a block which is highly plasma etchable or removable, can provide a high-resolution pattern definition. Examples of highly etchable blocks can comprise monomers which are rich in oxygen and which do not contain refractory elements and are capable of forming blocks which are highly etchable, such as methyl methacrylate. The plasma etching gases used in the etching process of defining the self-assembly pattern typically are those used in processes employed to make integrated circuits (IC). In this manner, very fine patterns can be created in typical IC substrates than were definable by conventional lithographic techniques, thus achieving pattern multiplication. Similarly, features such as contact holes can be made denser by using graphoepitaxy in which a suitable block copolymer arranges itself by directed self-assembly around an array of contact holes or posts defined by conventional lithography, thus forming a denser array of regions of etchable and etch resistant domains which when etched give rise to a denser array of contact holes. Consequently, graphoepitaxy has the potential to offer both pattern rectification and pattern multiplication.

In chemical epitaxy, or pinning chemical epitaxy, the self-assembly of the block copolymer is formed on a surface whose guiding features are regions of differing chemical affinity, having no, or insignificant topography (a.k.a. non-guiding topography) which predicates the directed self-assembly process. For example, the surface of a substrate could be patterned with conventional lithography (UV, Deep UV, e-beam EUV) to create surfaces of different chemical affinity in a line and space (L/S) pattern in which exposed areas whose surface chemistry had been modified by irradiation alternate with areas which are unexposed and show no chemical change. These areas present no topographical difference but do present a surface chemical difference or pinning to direct self-assembly of block copolymer segments. Specifically, the directed self-assembly of a block copolymer whose block segments contain etch resistant (such as styrene repeat unit) and rapidly etching repeat units (such as methyl methacrylate repeat units) would allow precise placement of etch resistant block segments and highly etchable block segments over the pattern. This technique allows for the precise placement of these block copolymers and the subsequent pattern transfer of the pattern into a substrate after plasma or wet etch processing. Chemical epitaxy has the advantage that it can be fine-tuned by changes in the chemical differences to help improve line-edge roughness and CD control, thus allowing for pattern rectification. Other types of patterns such as repeating contact holes (CH) arrays could also be pattern rectified using chemoepitaxy.

These neutral layers are layers on a substrate or the surface of a treated substrate which have no affinity for either of the block segment of a block copolymer employed in directed self-assembly. In the graphoepitaxy method of directed self-assembly of block copolymer, neutral layers are useful as they allow the proper placement or orientation of block polymer segments for directed self-assembly which leads to proper placement of etch resistant block polymer segments and highly etchable block polymer segments relative to the substrate. For instance, in surfaces containing line and space features which have been defined by conventional radiation lithography, a neutral layer allows block segments to be oriented so that the block segments are oriented perpendicular to the surface of the substrates, an orientation which is ideal for both pattern rectification and pattern multiplication depending on the length of the block segments in the block copolymer as related to the length between the lines defined by conventional lithography. If a substrate interacts too strongly with one of the block segments it would cause it to lie flat on that surface to maximize the surface of contact between the segment and the substrate; such a surface would perturb the desirable perpendicular alignment which can be used to either achieve pattern rectification or pattern multiplication based on features created through conventional lithography. Modification of selected small areas or pinning of substrate to make them strongly interactive with one block of the block copolymer and leaving the remainder of the surface coated with the neutral layer can be useful for forcing the alignment of the domains of the block copolymer in a desired direction, and this is the basis for the pinned chemoepitaxy or graphoepitaxy employed for pattern multiplication. The pinning area may be one which is hydrophilic having a greater affinity for example to polar block copolymer segments such as the polymethyl methacrylate block segment in a block copolymer of styrene and methyl methacrylate or alternatively be a pinning area which may be hydrophobic having a greater affinity for example to the polystyrene block segments in a block copolymer of styrene and methyl methacrylate.

There is a need to develop hydrophilic MAT pinning layer for DSA processing, that have simple formulations and components that do not require the presence of small molecule activators that release acid thermally or photochemically, as such formulation would avoid the issue of possible contamination of the overlying block copolymers during thermal annealing leading to the production of defects. For example, formulations of poly(methylmethacrylate-r-2-vinyloxethyl) P(MMA-r-VEMA) formulated in with para-toluene sulfonic acid triethylammonium salt as a thermal acid generator was developed as a hydrophilic crosslinking pinning MAT composition for use in reverse line flow DSA processing (U.S. Pat. No. 9,093,263). However, this thermal acid generator additive which needed to be added to thermally activate the crosslinking groups of VEMA which was observed to cause dark spot defects to occur when thermally curing the MAT layer on substrate, causing defects in subsequent DSA processes of an overlying layer of poly (methyl methacrylate-b-styrene) block copolymer. Additionally, the synthesis of P(MMA-r-VEMA) required post-polymerization modification using highly toxic tetramethylammonium hydroxide (TMAH) as reagent which may problematic when done at large scale, so there was a need to devise new hydrophilic MAT materials which could be more easily scalable and that would not require the need of curing additives to catalyze the crosslinking to avoid any possibly of defect formation when these materials are used as a MAT underlayer during DSA processing of an overlying block copolymer. The MAT layer in the context of the present invention is a crosslinked layer which is insoluble to any layer coated on top of it, which can be used as a DSA neutral or pinning layer.

DETAILED DESCRIPTION OF DRAWINGS

FIG. 1: Shows a representative $^{1}$H NMR spectra for P(MMA-r-TMOSiPrMA-r-TMSHEMA)

Figure 2:
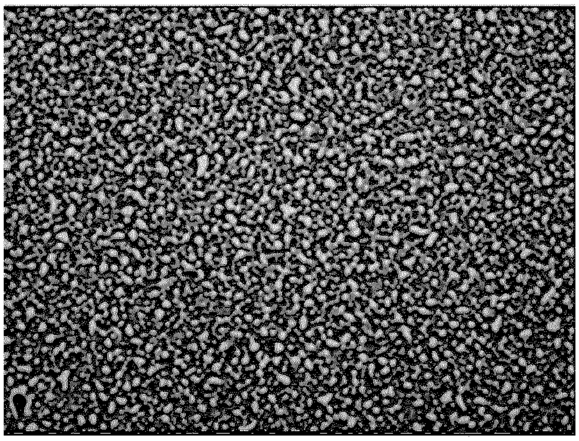

FIG. 2: SEM image showing parallel morphology for PME-7102 (Lo=29 nm, film thickness is 35 nm at 1500 rpm) and annealed at 250° C. on a crosslinked film of the material of Synthesis Example 2 on a silicon wafer.

SUMMARY OF THE INVENTION

This invention describes several different novel terpolymer hydrophilic crosslinking MAT compositions which all incorporate as a primary component a polar alkyl meth (acrylate) such as methyl methacrylate and whose resins were designed to be scalable in large quantities and which did not require the addition of thermal acid generator, photoacid generator, thermal radical generator or photoradical generator additives to enable curing. One of these is P(MMA-r-AMMA) [i.e., poly(methyl methacrylate-co-9-anthracenemethyl methacrylate) which crosslinks insufficiently to retain a hydrophilic film by itself but which can be made to crosslink sufficiently by the addition of a bismaleimide crosslinker which becomes incorporated into the crosslinked resin and avoids any issue of contamination of overlying block copolymer and formation of defects during DSA processing. Another approach to solve this problem was to use as a resin in the hydrophilic MAT formulation P(MMA-r-TMOSiPrMA) [i.e., poly(methyl methacrylate)-co-3-(trimethoxysilyl)propyl methacrylate] which could be crosslinked thermally using a low diffusion difunctional base additive and gave excellent film retention. Another approach was to use as a resin terpolymer P(MMA-r-TMOSiPrMA-r-TMSHEMA) [i.e., poly(methyl methacrylate-co-3-(trimethoxysilyl)propyl methacrylate)-co-2-trimethylsilyloxyethyl methacrylate)] which also gave a hydrophilic crosslinking pinning MAT with low coating defects but does not require the use of any acid or basic thermal or photochemical additives. In all these polymer designs the MMA component is needed for pinning the PS-b-PMMA diblock copolymer. The TMOSiPrMA component allows for crosslinking and gives excellent substrate adhesion. The TMSHEMA component masks the free hydroxyl group allowing the polymer to crosslink when baked. The methacrylic nature of all monomers makes this film highly hydrophilic. The low defects found in cured films of these materials enable better processing of the guide patterns and thus the DSA of BCPs reducing the number of defects.

Another aspect of this invention is an inventive random copolymer of structure (A) comprising:

An alkyl bearing repeat units of structure (I), wherein $R_I$ is a C-1 to C-8 alkyl, $R_{m1}$ is H or a C-1 to C-4 alkyl, and n1 is the total number of repeat units.

A trialkylsilyloxy bearing repeat units of structure (II), wherein $R_{II}$ is a moiety of structure (A-1), wherein $R_{m2}$ is H or a C-1 to C-4 alkyl, $L_1$ is either a direct valence bond or a C-1 to C-8 alkylene moiety, $R_{IIa}$, $R_{IIb}$ and $R_{IIc}$ are independently selected from a C-1 to C-4 alkyl, and n2 is the total number of repeat units;

At least one type of crosslinking repeat units of structure (III), wherein $R_{III}$ is a moiety of structure (A-2) or (A-3), or two different types of repeat units of structure (III) in which $R_{III}$ is either a moiety of structure (A-2) or a moiety of structure (A-3), wherein $Rs_1$ is a C-1 to C-4 alkyl, Rs is a C-1 to C-4 alkyl, x is 0, 1 or 2, and $L_2$ and $L_3$ are independently, either a direct valence bond or a C-1 to C-10 alkylene moiety, and $R_{ox}$ is an aliphatic moiety comprising an oxirane, and n3 is the total number of repeat units, two end groups as shown in structure (A) one of which is H and the other is a methyl moiety substituted with Rr, $Rr_1$ and $Rr_2$, wherein $Rr_1$, $Rr_2$ are independently selected from a C-1 to C-8 alkyl and Rr is a cyano moiety (—CN) or a carbonylalkyl moiety (—C(═O)—Ri), where Ri is a C-1 to C-8 alkyl or an aryl moiety;

(A)

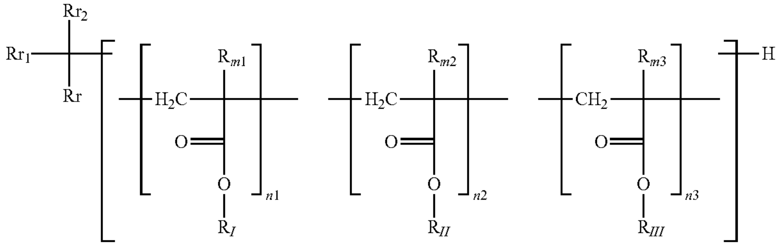

(I) (II) (III)

(A-1)

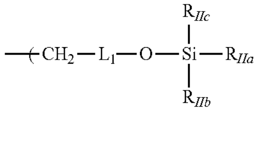

(A-2)

$—CH_2—L_2—Si(Rs_1)_x(ORs)_{3-x}$ (A-3)

$—CH_2—L_3—R_{ox}$

Another aspect of this invention are compositions comprising:

a random copolymer comprising:

an alkyl bearing repeat units of structure (I), wherein $R_I$ is a C-1 to C-8 alkyl, $R_{m1}$ is H or a C-1 to C-4 alkyl, at least one type of crosslinkable repeat unit which does not require an acid catalyst to undergo crosslinking, derived from an alkyl 2-methylenealkanoate (alkyl-O—C(═O)—C(alkyl)=$CH_2$ or a or an alkyl methacrylate (alkyl-O—C(═O)—CH═$CH_2$, wherein said alkyloxy moiety is substituted with a crosslinkable moiety selected from the group consisting of a trialkylsilyloxy, an oxirane, a trialkyloxysilyl, and an anthracene, a spin casting solvent, and does not contain a thermal acid generator, photoacid generator, thermal radical generator or photo-radical generator.

(I)

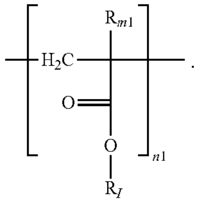

Another aspect of this invention is the process of coating these compositions and thermally producing a crosslinked polar MAT pinning layer without the use of a thermal acid generator, photoacid generator, thermal radical generator or photo-radical generator, Another aspect of this invention is the use of these crosslinked polar MAT coatings in DSA processing.

DETAILED DESCRIPTION OF THE INVENTION

It is to be understood that both the foregoing general description and the following detailed description are illustrative and explanatory, and are not restrictive of the subject matter, as claimed. In this application, the use of the singular includes the plural, the word "a" or "an" means "at least one", and the use of "or" means "and/or", unless specifically stated otherwise. Furthermore, the use of the term "including," as well as other forms such as "includes" and "included", is not limiting. Also, terms such as "element" or "component" encompass both elements and components comprising one unit and elements or components that comprise more than one unit, unless specifically stated otherwise. As used herein, the conjunction "and" is intended to be inclusive and the conjunction "or" is not intended to be exclusive unless otherwise indicated. For example, the phrase "or, alternatively" is intended to be exclusive. As used herein, the term "and/or" refers to any combination of the foregoing elements including using a single element.

The term C-1 to C-4 alkyl embodies methyl and C-2 to C-4 linear alkyls and C-3 to C-4 branched alkyl moieties, for example as follows: methyl(-$CH_3$), ethyl (—$CH_2$—$CH_3$), n-propyl (—$CH_2$—$CH_2$—$CH_3$), isopropyl (—$CH(CH_3)_2$, n-butyl (—$CH_2$—$CH_2$—$CH_2$—$CH_3$), tert-butyl (—C$(CH_3)_3$), isobutyl ($CH_2$—$CH(CH_3)_2$, 2-butyl (—$CH(CH_3)$ $CH_2$—$CH_3$). Similarly, the term C-1 to C-8 alkyl embodies methyl C-2 to C-8 linear alkyls, C-3 to C-8 branched alkyls, C-4 to C-8 cycloalkyls (e.g., cyclopentyl, cyclohexyl etc) or C-5-C-8 alkylenecycloalkyls (e.g., —$CH_2$-cyclohexyl, $CH_2$—$CH_2$-cyclopentyl etc).

The term C-2 to C-5 alkylene embodies C-2 to C-5 linear alkylene moieties (e.g. ethylene, propylene etc.) and C-3 to C-5 branched alkylene moieties (e.g., —$CH(CH_3)$—, —CH$(CH_3)$—$CH_2$—, etc.).

Di-block and triblock copolymers of styrenic and alkyl 2-methylenealkanoate derived repeat unit moieties useful as components in the inventive compositions described herein may be made by a variety of methods, such as anionic polymerization, atom transfer radical polymerization (ATRP), Reversible addition-fragmentation chain transfer (RAFT) polymerization, living radical polymerization and the like (Macromolecules 2019, 52, 2987-2994; Macromol. Rapid Commun. 2018, 39, 1800479; A. Deiter Shluter et al Synthesis of Polymers, 2014, Volume 1, p315; Encyclopedia of Polymer Science and Technology, 2014, Vol 7, p 625.).

The random copolymer poly(styrene-co-methyl methacrylate) is abbreviated as "P(S-co-MMA)," and the oligomeric version of this materials is abbreviated P(S-co-MMA). Similarly, the block copolymer poly(styrene-block-methyl methacrylate) is abbreviated as P(S-b-MMA), while the oligomer of this material is abbreviated as oligo(S-b-MMA). The oligomer oligo(styrene-co-p-octylstyrene)-block-(methyl methacrylate-co-di(ethylene glycol) methyl ether methacrylate) uses the same abbreviations to designate random an block copolymer elements, specifically oligo(S-co-p-OS)-b-P(MMA-co-DEGMEMA), in which S=styrene, p-OS=para-octylstyrene, MMA=methacrylate, DEGMEMA=di(ethylene glycol) methyl ether methacrylate designate the repeat units in this block copolymer whose two blocks are random copolymers.

FOV is the abbreviation for "field of view" for top-down scanning electron micrographs (SEM) for the SEM FIGs. in this application. "L/S," is an abbreviation for "line and space" lithographic features.

PGMEA and PGME are respectively abbreviations for 1-methoxypropan-2-yl acetate and 1-methoxypropan-2-ol.

The section headings used herein are for organizational purposes and are not to be construed as limiting the subject matter described. All documents, or portions of documents, cited in this application, including, but not limited to, patents, patent applications, articles, books, and treatises, are hereby expressly incorporated herein by reference in their entirety for any purpose. In the event that one or more of the incorporated literature references and similar materials defines a term in a manner that contradicts the definition of that term in this application, this application controls.

Unless otherwise indicated, "alkyl" refers to hydrocarbon groups which can be linear, branched (e.g. methyl, ethyl, propyl, isopropyl, tert-butyl and the like) or cyclic (e.g. cyclohexyl, cyclopropyl, cyclopentyl and the like) multicyclic (e.g. norbornyl, adamantyl and the like). These alkyl moieties may be substituted or unsubstituted as described below. The term "alkyl" refers to such moieties with C-1 to C-8 carbons. It is understood that for structural reasons linear alkyls start with C-1, while branched alkyls and cyclic alkyls start with C-3 and multicyclic alkyls start with C-5. Moreover, it is further understood that moieties derived from alkyls described below, such as alkyloxy and perfluoroalkyl, have the same carbon number ranges unless otherwise indicated. If the length of the alkyl group is specified as other than described above, the above described definition of alkyl still stands with respect to it encompassing all types of alkyl moieties as described above and that the structural consideration with regards to minimum number of carbons for a given type of alkyl group still apply.

Alkyloxy (a.k.a. Alkoxy) refers to an alkyl group on which is attached through an oxy (—O—) moiety (e.g. methoxy, ethoxy, propoxy, butoxy, 1,2-isopropoxy, cyclopentyloxy cyclohexyloxy and the like). These alkyloxy moieties may be substituted or unsubstituted as described below.

aliphatic moiety comprising an oxirane, and n3 is the total number of repeat units, two end groups as shown in structure (A) one of which is H and the other is a methyl moiety substituted with Rr, $Rr_1$ and $Rr_2$, wherein $Rr_1$, $Rr_2$ are independently selected from a C-1 to C-8 alkyl and Rr is a cyano moiety (—CN) or a carbonylalkyl moiety (—C(=O)—Ri), where Ri is a C-1 to C-8 alkyl or an aryl moiety;

(A)

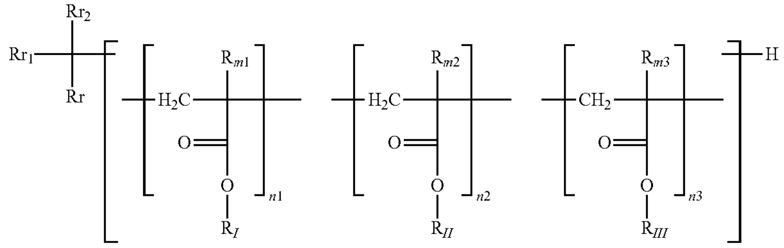

(I) (II) (III)

(A-1)

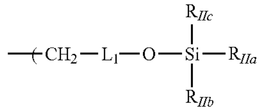

(A-2)

$-\!\!\left(CH_2-L_2-Si(Rs_1)_x(ORs)_{3-x}\right.$ (A-3)

$-\!\!\left(CH_2-L_3-R_{ox}\right.$

Halo or halide refers to a halogen, F, Cl, Br or I which is linked by one bond to an organic moiety.

As used herein the term lactone encompasses both mono-lactones (e.g., caprolactone) and di-lactones (e.g., lactide).

Haloalkyl refers to a linear, cyclic or branched saturated alkyl group such as defined above in which at least one of the hydrogens has been replaced by a halide selected from the group of F, Cl, Br, I or mixture of these if more than one halo moiety is present. Fluoroalkyls are a specific subgroup of these moieties.

Perfluoroalkyl refers to a linear, cyclic or branched saturated alkyl group as defined above in which the hydrogens have all been replaced by fluorine (e.g., trifluoromethyl, perfluoroethyl, perfluoroisopropyl, perfluorocyclohexyl and the like).

Copolymer of Structure (A)

One aspect of this invention is an inventive random copolymer of structure (A) comprising:

An alkyl bearing repeat units of structure (I), wherein $R_I$ is a C-1 to C-8 alkyl, $R_{m1}$ is H or a C-1 to C-4 alkyl, and n1 is the total number of repeat units;

A trialkylsilyloxy bearing repeat units of structure (II), wherein $R_{II}$ is a moiety of structure (A-1), wherein $R_{m2}$ is H or a C-1 to C-4 alkyl, $L_1$ is either a direct valence bond or a C-1 to C-8 alkylene moiety, $R_{IIa}$, $R_{IIb}$ and $R_{IIc}$ are independently selected from a C-1 to C-4 alkyl, and n2 is the total number of repeat units;

At least one type of crosslinking repeat units of structure (III), wherein $R_{III}$ is a moiety of structure (A-2) or (A-3), or two different types of repeat units of structure (III) in which $R_{III}$ is either a moiety of structure (A-2) or a moiety of structure (A-3), wherein $Rs_1$ is a C-1 to C-4 alkyl, Rs is a C-1 to C-4 alkyl, x is 0, 1 or 2, and $L_2$ and $L_3$ are independently, either a direct valence bond or a C-1 to C-10 alkylene moiety, and $R_{ox}$ is an In another aspect of the inventive copolymer of structure (A), said repeat units consist essentially of repeat units of structures (I), (II), and (III), wherein the repeat units of structure (III) are a single type of crosslinking repeat unit of structure (III), and $R_{III}$ is a moiety of structure (A-2) or structure (A-3).

In another aspect of the inventive copolymer of structure (A), said repeat units consist essentially of repeat units of structures (I), (II), and (III), wherein the repeat units of structure (III) are two different types of repeat units of structure (III) in which $R_{II}$m is a moiety of structure (A-2) or structure (A-3).

In another aspect of the inventive copolymer of structure (A), said repeat units consist of repeat units of structures (I), (II), and (III), wherein the repeat units of structure (III) is a single type of crosslinking repeat unit of structure (III), and $R_{III}$ is a moiety of structure (A-2) or structure (A-3).

In another aspect of the inventive copolymer of structure (A), said repeat units consist of repeat units of structures (I), (II), and (III), wherein the repeat units of structure (III) are two different types of repeat units of structure (III) in which $R_{III}$ is a moiety of structure (A-2) or structure (A-3).

In another aspect of the inventive copolymer of structure (A), $R_{III}$ has structure (A-2). In another aspect of this embodiment x is 1. In another aspect of this embodiment x is 2. In another aspect of this embodiment x is 0. In yet another aspect of this embodiment $L_2$ is a C-2 to C-4 alkylene moiety.

In another aspect of the inventive copolymer of structure (A), $R_{III}$ has structure (A-2a). In one aspect of this embodiment Rs is a C-1 to C-4 alkyl. In another aspect of this embodiment $R_{III}$ has structure (A-2b).

(A-2)

$—(CH_2—L_2—Si(Rs_1)_x(ORs)_{3-x}$ (A-2a)

$—(CH_2—CH_2—CH_2—Si(ORs)_3$ (A-2b)

$—(CH_2—CH_2—CH_2—Si(OCH_3)_3$.

In another aspect of the inventive copolymer of structure (A), $R_{III}$ has structure (A-3). In one aspect of this embodiment $R_{III}$ has structure (A-3a), wherein $R_e$, $R_{e1}$ and $R_{e2}$ are individually selected from H or a C-1 to C-8 alkyl, and further wherein when $R_{e2}$ and either $R_e$ or $R_{e1}$ are a C-1 to C-4 alkyl groups, $R_{e2}$ and $R_e$, or $R_{e2}$ and $R_{e1}$ may be joined through a C-1 to C-4 alkylene to form a cyclic ring. In another aspect of this embodiment $R_e$ is a C-1 to C-8 alkyl moiety and $R_{e1}$, and $R_{e2}$ are H. In another aspect of this embodiment $R_e$, and $R_{e1}$ is a C-1 to C-8 alkyl moiety and $R_{e2}$ is H. In another aspect of this embodiment $R_e$, $R_{e1}$ and $R_{e2}$ are individually a C-1 to C-8 alkyl moiety. In another aspect of this embodiment $R_e$, is H and $R_{e1}$ and $R_{e2}$ are individually a C-1 to C-8 alkyl. In another aspect of this embodiment $R_e$, is H and $R_{e1}$ is a C-1 to C-8 alkyl moiety and $R_{e2}$ is H.

(A-3)

$—(CH_2—L_3—R_{ox}$ (A-3a)

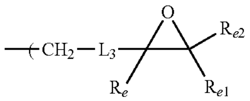

In another aspect of the inventive copolymer of structure (A), $R_{III}$ has structure (A-3), $R_{III}$ has structure (A-3) and this moiety has the more specific structure (A-3b), wherein cy is an integer ranging from 1 to 3.

(A-3b)

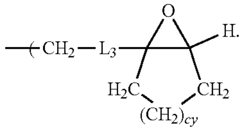

In another aspect of the inventive copolymer of structure (A), $R_{III}$ has structure (A-3), $R_{III}$ has structure (A-3) and this moiety has the more specific structure (A-3c).

(A-3c)

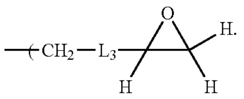

In another aspect of the inventive copolymer of structure (A), $R_{III}$ has structure (A-3), $R_{III}$ has structure (A-3) and this moiety has the more specific structure (A-3d).

(A-3d)

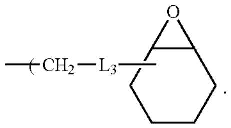

In another aspect of the inventive copolymer of structure (A), $R_{III}$ has structure (A-3), $R_{III}$ has structure (A-3) and this moiety has the more specific structure (A-3e).

(A-3e)

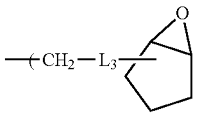

In another aspect of the inventive copolymers of structure (A), $R_{III}$ has structure (A-3) or one of the more specific more specific substructures of structure (A-3), namely (A-3a) to (A-3e), $L_3$ is a direct valence bond or a C-1 to C-2 alkylene moiety.

In another aspect of the inventive copolymers of structure (A), $R_{III}$ has structure (A-3), $R_{III}$ has structure (A-3f).

(A-3f)

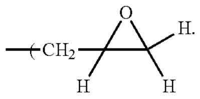

In another aspect of the inventive copolymers of structure (A), $R_{III}$ has structure (A-3), $R_{III}$ has structure (A-3g).

(A-3g)

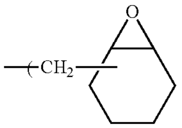

In another aspect of the inventive copolymers of structure (A), $R_{III}$ has structure (A-3), $R_{III}$ has structure (A-3h).

(A-3h)

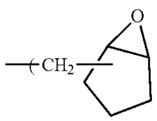

In another aspect of the inventive copolymers of structure (A), in structure (A-1), $R_{IIa}$, $R_{IIb}$ and $R_{IIc}$ are selected from the same C-1 to C-4 alkyl.

(A-1)

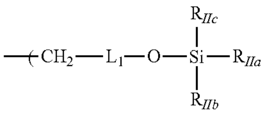

In another aspect of the inventive copolymers of structure (A), in structure (A-1), $L_1$ is a C-1 to C-3 alkylene moiety.

In another aspect of the inventive copolymers of structure (A), in structure (A-1), $R_{II}$ has structure (A-1a)

$$-\!\!\left( CH_2-L_1-O-Si(CH_3)_3 \right.$$

In another aspect of the inventive copolymers of structure (A), in structure (A-1), $R_{II}$ has structure (A-1b).

(A-1b)

$$-\!\!\left( CH_2-CH_2-O-Si(CH_3)_3 \right.$$

In another aspect of the inventive copolymers of structure (A), $R_I$ is a C-1 to C-4 alkyl. In another aspect of this embodiment, it is a C-1 to C-3 alkyl. In yet another aspect of this embodiment, $R_I$ is a methyl or ethyl. In still another aspect of this embodiment, $R_I$ is methyl.

In one aspect of the inventive copolymers of structure (A) in the repeat unit of structure (I), $R_{m1}$ is H. In another aspect, $R_{m1}$ is a C-1 to C-4 alkyl. In still another aspect, $R_{m1}$ is methyl.

In one embodiment of the inventive copolymers of structure (A) in the repeat unit of structure (II), $R_{m2}$ is a C-1 to C-4 alkyl. In another aspect of this embodiment, $R_{m2}$ is methyl. In still another aspect, $R_{m2}$ is H.

In one embodiment of the inventive copolymers of structure (A), in the repeat unit of structure (III), $R_{m3}$ is a C-1 to C-4 alkyl. In another aspect of this embodiment, $R_{m3}$ is methyl. In still another aspect $R_{m3}$ is H.

In one embodiment of the inventive copolymers of structure (A), $R_{m1}$, $R_{m2}$ and $R_{m3}$ are methyl.

In one embodiment of the inventive copolymers of structure (A), in the end group Rr is a cyano moiety. In one embodiment of the inventive copolymers of structure (A), in the end group Rr is a carboxyalkyl moiety. In one aspect of this embodiment, Ri is a C-1 to C-8 alkyl. In another aspect of this embodiment Ri is an aryl. In one embodiment of the inventive copolymers of structure (A), in the end group $Rr_1$ and $Rr_2$ are independently a C-1 to C-4 alkyl. In another aspect of this embodiment, $Rr_1$ and $Rr_2$ are methyl.

In one embodiment of the inventive copolymers of structure (A), the repeat unit of structure (I), has structure (Ia).

In one embodiment of the inventive copolymers of structure (A), the repeat unit of structure (II), has structure (IIa).

In one embodiment of the inventive copolymers of structure (A), the repeat unit of structure (III), have structure (IIIa).

In one embodiment of the inventive copolymers of structure (A), the repeat units of structure (III), all have structure (IIIb).

(Ia)

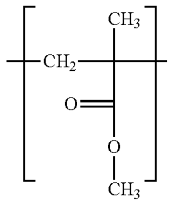

-continued (IIa)

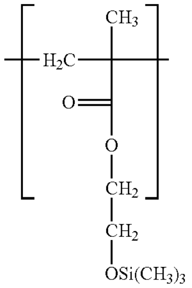

(IIIa)

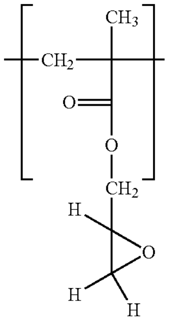

(IIIb)

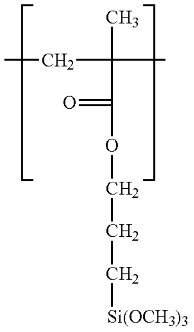

In one embodiment of the inventive copolymers of structure (A), the repeat units of structure (III), are a mixture of ones having structure (IIIa) and (IIIb).

In one embodiment of the inventive copolymers of structure (A), based on the total number of moles of repeat units of structures (I), (II) and (III), the mole % of the repeat unit of structure (I) ranges from about 65 mole % to about 90 mole %, the mole % of the repeat units of structure (II) ranges from about 5 mole % to about 22 mole % and the repeat units of structure (III) which have as $R_{III}$ either the moiety of structure (A-2) or (A-3) range in total from about 5 mole % to about 22 mole %, and further where the total of the mole % of the repeat unit of structures (I), (II), and (III) equal 100 mole %.

In one embodiment of the inventive copolymers of structure (A), said copolymer has structure (Aa). In one aspect of this embodiment, based on the total number of moles of repeat units of structures (Ia), (IIa) and (IIIa), the mole % of the repeat unit of structure (Ia) ranges from about 65 mole % to about 90 mole %, the mole % of the repeat unit of structure (IIa) ranges from about 5 mole % to about 22 mole % and the repeat unit of structure (IIIa) ranges from about 5 mole % to about 22 mole %, and further where the total of the mole % of the repeat unit of structures (Ia), (IIa), and (IIIa) equal 100 mole %.

(Aa)

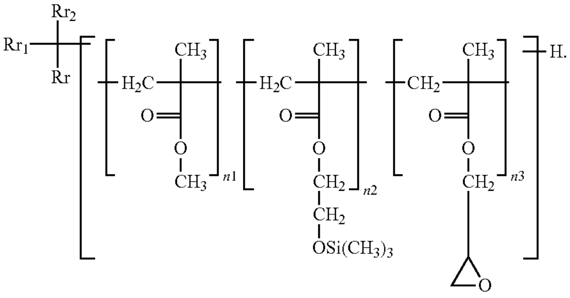

(Ia) (IIa) (IIIa)

(Ab)

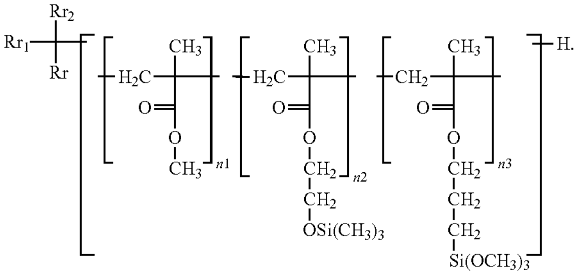

(Ia) (IIa) (IIIb)

In one embodiment of the inventive copolymers of structure (A), said copolymer has structure (Ab), wherein n1, n2, and n3, respectively, denote the number each repeat unit of structures (Ia), (IIa), and (IIIb). In one aspect of this embodiment, based on the total number of moles of repeat units of structures (Ia), (IIa) and (IIIb), the mole % of the repeat unit of structure (Ia) ranges from about 65 mole % to about 90 mole %, the mole % of the repeat unit of structure (IIa) ranges from about 5 mole % to about 22 mole % and the repeat unit of structure (IIIb) ranges from about 5 mole % to about 22 mole %, and further where the total of the mole % of the repeat unit of structures (Ia), (IIa), and (IIIb) equals 100 mole %.

In one embodiment of the inventive copolymers of structure (A), said copolymer has structure has structure (Ac) wherein n1, n2, n3 and n3a, respectively, denote the number each repeat unit of structures (Ia), (IIa), (IIIa) and (IIIb), In one aspect of this embodiment, based on the total number of moles of repeat units of structures (Ia), (IIa), (IIIa) and (IIIb), the mole % of the repeat unit of structure (Ia) ranges from about 65 mole % (preferably from about 68 mole %) to about 90 mole %, the mole % of the repeat unit of structure (IIa) ranges from about 5 mole % to about 10 mole % and the total number of repeat unit of structures (IIIa) and (IIIb) ranges from about 5 mole % to about 22 mole %, and further where the total of the mole % of the repeat unit of structures (Ia), (IIa), (IIIa), (IIIb) equal 100 mole %.

(Ac)

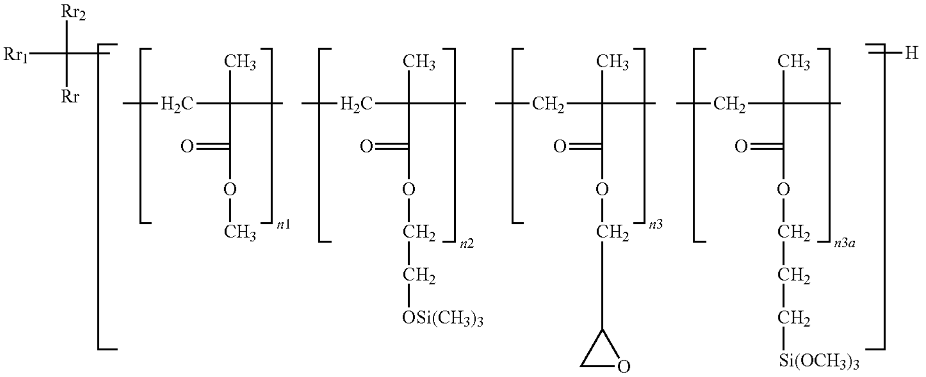

(Ia) (IIa) (IIIa) (IIIb)

In one embodiment of the inventive copolymers of structure (A), described herein, said copolymer has a Mw ranging from about 15,000 to about 50,000. In another aspect of this embodiment, said copolymer also has a polydispersity ranging from about 1.2 to about 2.5.

Compositions Comprising a Random Copolymer Comprising a Repeat Unit of Structure (I) and at Least One Type of Repeat Unit Comprising a Crosslinkable Moiety Selected from a Trialkylsilyloxy, an Oxirane, a Trialkyloxysilyl, and an Anthracene, Another aspect of this invention are compositions comprising:

- a random copolymer comprising:
  - an alkyl bearing repeat units of structure (I), wherein $R_I$ is a C-1 to C-8 alkyl, $R_{m1}$ is H or a C-1 to C-4 alkyl,
  - at least one type of crosslinkable repeat unit which does not require an acid catalyst to undergo crosslinking, derived from an alkyl 2-methylenealkanoate (alkyl-O—C(═O)—C(alkyl)=$CH_2$ or an alkyl methacrylate (alkyl-O—C(═O)—CH═$CH_2$, wherein said alkyloxy moiety is substituted with a crosslinkable moiety selected from the group consisting of a trialkylsilyloxy, an oxirane, a trialkyloxysilyl, and an anthracene,
- a spin casting solvent, and
- does not contain a thermal acid generator, photoacid generator, thermal radical generator or photo-radical generator.

In one aspect of this embodiment this composition comprises a random copolymer of structure (A) as described as follows.

Other embodiments of this concept are the compositions as described herein which comprise random copolymers of structure (C), (D) and (E).

(I)

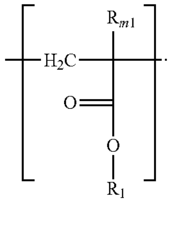

Composition Comprising a Copolymer of Structure (A) and a Spin Casting Organic Solvent Another aspect of this invention is a composition comprising any one of the copolymer of structure (A) described herein and a spin casting organic solvent.

In one aspect of this inventive composition, it further comprises a single crosslinker of structure (B), or a mixture of at least two different crosslinkers of structure (B), wherein $L_5$ is a C-4 to C-8 alkylene which has a length of at least 4 carbon atoms, and $R_{a1}$, $R_{a2}$, $R_{a3}$ and $R_{a4}$ are independently selected from a C-4 to C-8 alkyl. In one aspect of this embodiment, $L_5$ is a C-4 to C-6 alkylene. In another aspect it has structure (B-1). In one aspect of these embodiments $R_{a1}$, $R_{a2}$, $R_{a3}$ and $R_{a4}$ are a C-3 to C-6 alkyl. In a further aspect of these embodiments $R_{a1}$, $R_{a2}$, $R_{a3}$ and $R_{a4}$ are n-butyl. In yet another aspect this crosslinker has structure (B-2).

(B)

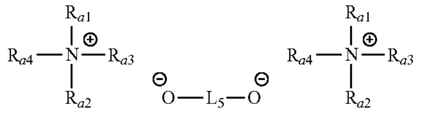

(B-1)

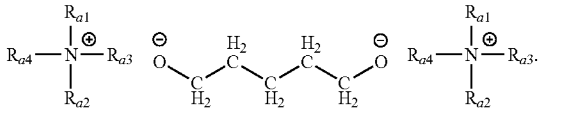

(B-2)

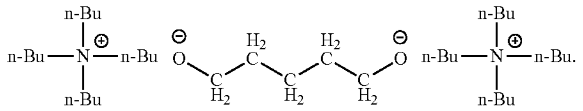

In one aspect of this inventive composition it comprises a single type of crosslinker of structures (B), (B-1), or (B-2).

In one aspect of this inventive composition it comprises a mixture of at least two different types of crosslinkers of structures (B), (B-1) or (B-2).

In one aspect of this composition, it comprises from about 0.2 wt. % to about 2.0 wt. % of said copolymer, and about 98.0 wt. % to about 99.8 wt. % of said spin casting organic solvent, where the sum of these wt. % ranges is 100 wt. % or less. In one aspect of this embodiment it consists only of these two components.

In one aspect of this composition, it comprises from about comprises of about 0.2 wt. % to about 2.0 wt. % of said copolymer, about 0.02 wt. % to about 0.04 wt. % of said crosslinker, and about 98.0 wt. % to about 99.8 wt. % of said spin casting organic solvent, where the sum of these wt. % ranges equals 100 wt. %. In one aspect of this embodiment it consists only of these three components.

In one embodiment of composition comprising copolymers of structure (A), described herein, these are free of a thermal acid generator, photoacid generator, thermal radical generator or photo-radical generator.

Compositions Comprising Copolymer of Structure (C) a Crosslinker of Structure (M-1) and a Spin Casting Organic Solvent Another aspect of this invention is a composition comprising:

- A random copolymer having structure (C), comprising
  - an alkyl bearing repeat units of structure (I), wherein $R_I$ is a C-1 to C-8 alkyl, $R_{m1}$ is H or a C-1 to C-4 alkyl, and n1 is the total number of repeat units,
  - an anthracene bearing repeat unit of structure (IV), wherein $R_{m4}$ is H or a C-1 to C-4 alkyl, $L_4$ is a C-1 to C-8 alkylene and n4 is the total number of repeat units,
  - two end groups as shown in structure (C), one of which is H and the other is a methyl moiety substituted with Rr, $Rr_1$ and $Rr_2$, wherein $Rr_1$, and $Rr_2$ are independently selected from a C-1 to C-8 alkyl and Rr is a cyano moiety (—CN) or a carbonylalkyl moiety (—C(═O)—Ri), where Ri is a C-1 to C-8 alkyl or an aryl moiety;
- At least one crosslinker of structure (M-1), or a mixture of at least two different crosslinker of structure (M-1), wherein;
  - L is a linking group selected from a C-1-C-8 linear alkylene, a C-2 to C-8 branched alkylene, a C-6 to C-20 alkylene-oxy-alkylene lining group, a C-6 to C-20, alkylene-oxy-alkylene-oxy-alkylene linking group, an aryl linking group having structure (M-1a), and an bis-aryl linking group having structure (M-1b), wherein in structures (M-1a) and (M-1b),  designates the attachment points of these linking groups, $R_{bm}$, $R_{bm1}$, and $R_{bm2}$, are independently selected from H and a C-1 to C-8 alkyl, X is a direct valence bond or is a linking group, selected from the group consisting of sulfone (—S(═O)$_2$—), sulfoxide (—S(═O)—), carbonyl, (—C(═O)—), carbonate (—O—C(═O)—O), oxycarbonyl (—O—C(═O)—), carbonyloxy (—C(═O)—O—), C-1 to C-8 linear alkylene spacer, C-2-C-8 branched alkylene, C-5-C-8 cyclic alkylene, oxy (—O—), and a sulfide (—S—);

A spin casting organic solvent.

(C)

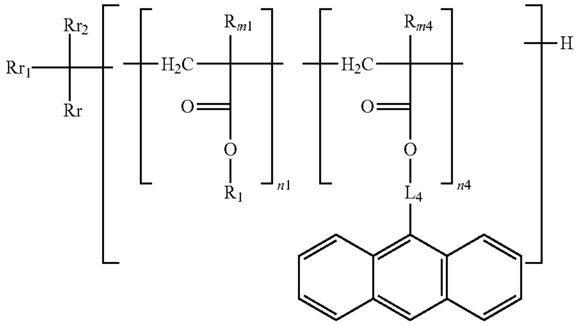

(I) (IV)

(M-1)

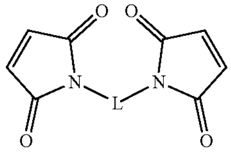

(M-1a)

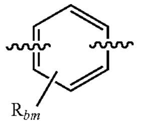

(M-1b)

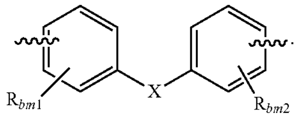

In one embodiment of this composition the copolymer of structure (C) consist essentially of repeat units of structures (I), and (IV). In one aspect of this embodiment said copolymer of structure (C) consist of repeat units of structures (I), and (IV).

In another embodiment of this composition the copolymer of structure (C) it is one wherein the mole % of the repeat unit of structure (I) ranges from about 70 mole % to about 90 mole %, and the mole % of the repeat unit of structure (IV) ranges from about 10 mole % to about 30 mole %, and further where the total of the mole % of the repeat unit of structures (I), and (IV) equal 100 mole %. In another aspect of this embodiment, said copolymer has a Mw ranging from about 15,000 to about 120,000. In another aspect of this embodiment said copolymer has a polydispersity ranging from 1.2 to about 2.5.

In another embodiment of this composition the copolymer of structure (C) is one wherein in the repeat unit of structure (I), $R_I$ is a C-1 to C-4 alkyl. In another aspect of this embodiment, $R_I$ is a C-1 to C-3 alkyl. In yet another aspect, $R_I$ is methyl or ethyl. In still another aspect, $R_I$ is methyl. In another embodiment of this composition the copolymer of structure (C) is one wherein in the repeat unit of structure (IV), $L_4$ is a C-1 to C-4 alkylene. In another aspect of this embodiment, $L_4$ is a C-1 to C-2 alkylene. In still another aspect of this embodiment the repeat unit of structure (IV), has structure (IVa). In another aspect of these embodiments, $R_{m1}$ and $R_{m2}$ are individually selected from a C-1 to C-4 alkyl. In another aspect of this embodiment $R_{m1}$ and $R_{m2}$ are methyl. In still another aspect of this embodiment $R_{m1}$ and $R_{m2}$ are H.

(IVa)

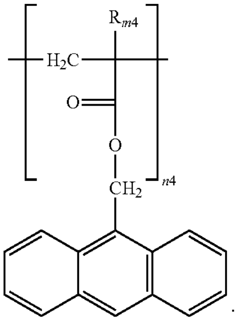

In another embodiment of this composition the copolymer of structure (C) it is one wherein the mole % of the repeat unit of structure (I) ranges from about 70 mole % to about 90 mole %, and the mole % of the repeat unit of structure (IV) ranges from about 10 mole % to about 30 mole %, and further where the total of the mole % of the repeat unit of structures (I), and (IV) equal 100 mole %. In another aspect of this embodiment, said copolymer has a Mw ranging from about 15,000 to about 120,000. In another aspect of this embodiment said copolymer has a polydispersity ranging from 1.2 to about 2.5.

In another embodiment of this composition, the copolymer of structure (C) has structure (C-1). In another aspect of this embodiment the mole % of the repeat unit of structure (Ia) ranges from about 70 mole % to about 90 mole %, and the mole % of the repeat unit of structure (IVa) ranges from about 10 mole % to about 30 mole %, and further where the total of the mole % of the repeat unit of structures (Ia), and (IVa) equal 100 mole %. In another aspect of this embodiment, said copolymer has a Mw ranging from about 15,000 to about 120,000. In another aspect of this embodiment said copolymer has a polydispersity ranging from 1.2 to about 2.5.

(C-1)

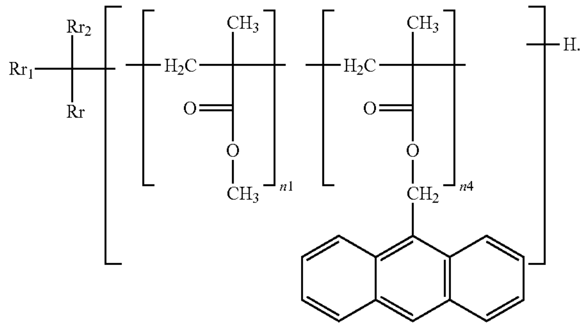

(Ia) (IVa)

In another embodiment of this composition, said cross-linker of structure (M-1), has structures (M-1c), (M-1d), (M-1e), (M-1f), (M-1g), (M-1h), or is a mixture of at least two of these.

(M-1c)

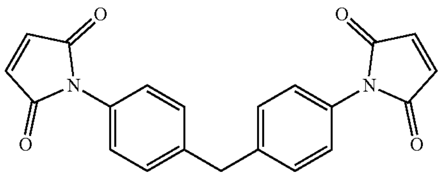

(M-1d)

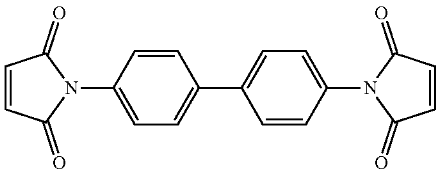

(M-1e)

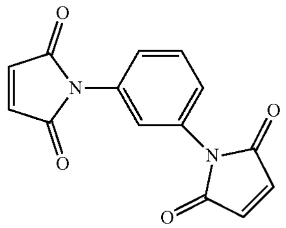

(M-1f)

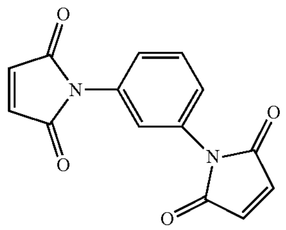

(M-1g)

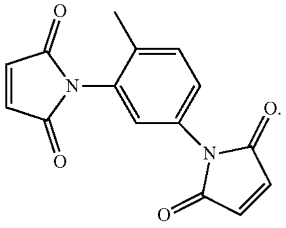

-continued (M-1h)

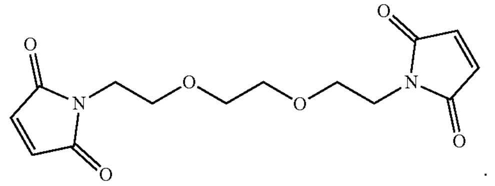

In another embodiment the composition, it consists of about 0.2 wt. % to about 2.0 wt. % of said copolymer, about 0.02 wt. % to about 0.04 wt. % of said crosslinker, and about 98.0 wt. % to about 99.8 wt. % of said spin casting organic solvent, where the sum of these wt. % ranges equals 100 wt. %.

In another embodiment of this composition said cross-linker is one type of crosslinker of structure (M-1).

In another embodiment of this composition said cross-linker is at least two different types of crosslinkers of structure (M-1).

In one embodiment of composition comprising copolymers of structure (C), described herein, these are free of thermal acid generator, photoacid generator, thermal radical generator or photo-radical generator.

Compositions comprising a copolymer of structure (D), a crosslinker of structure (B) and a spin casting organic solvent.

Another aspect of this invention is a composition comprising:

A random copolymer having structure (D), comprising:

- an alkyl bearing repeat units of structure (I), wherein $R_I$ is a C-1 to C-8 alkyl, $R_{m1}$ is H or a C-1 to C-4 alkyl, and n1 is the total number of repeat units,
- a crosslinking repeat unit of structure (III), wherein $R_{m3}$ is H or a C-1 to C-4 alkyl, and $R_v$ is a moiety of structure (A-2) in which $R_{III}$ is either a moiety of structure (A-2), wherein $Rs_1$ is a C-1 to C-4 alkyl, Rs is a C-1 to C-4 alkyl, x is 0, 1 or 2, and $L_2$ is either a direct valence bond or a C-1 to C-10 alkylene moiety, and n3 is the total number of repeat units,
- two end groups as shown in structure (D), one of which is H and the other is a methyl moiety substituted with Rr, $Rr_1$ and $Rr_2$, wherein $Rr_1$, and $Rr_2$ are independently selected from a C-1 to C-8 alkyl and Rr is a cyano moiety (—CN) or a carbonylalkyl moiety (—C(=O)—Ri), where Ri is a C-1 to C-8 alkyl or an aryl moiety, At least one crosslinker of structure (B), wherein $L_5$ is a C-4 to C-8 alkylene which has a length of at least 4 carbon atoms, $R_{a1}$, $R_a2$, $R_{a3}$ and $R_{a4}$ are independently selected from a C-4 to C-8 alkyl; and a spin casting organic solvent;

(D)

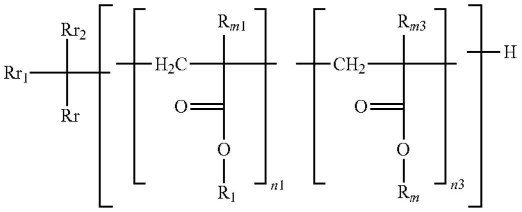

(I) (III)

-continued (A-2)

$$-\!\!\left(CH_2-L_2-Si(Rs_1)_x(ORs)_{3-x}\right.$$

(B)

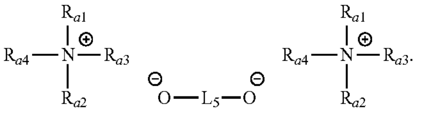

In another embodiment of this composition, it said copolymer of structure (D) consist essentially of repeat units of structures (I), and (III). In another aspect of this embodiment said copolymer of structure (D) consist of repeat units of structures (I), and (III).

In another embodiment of this composition said copolymer of structure (D) is one wherein for the repeat unit of structure (I), $R_I$ is a C-1 to C-4 alkyl. In another aspect of this embodiment Ri is a C-1 to C-3 alkyl. In another aspect of this embodiment $R_I$ is methyl or ethyl. In yet another aspect of this embodiment, $R_I$ is methyl.

In another embodiment of this composition, said copolymer of structure (D) is one wherein $R_{m1}$ is a C-1 to C-4 alkyl. In another aspect of this embodiment $R_{m1}$ is methyl.

In another embodiment of this composition said copolymer of structure (D) is one wherein $R_{m1}$ is H.

In another embodiment of this composition, said copolymer of structure (D) is one wherein in structure (A-2) x is 1. In another aspect of this embodiment, it is one wherein in structure (A-2) x is 2. In another aspect of this embodiment, it is one wherein in structure (A-2) x is 0.

In another embodiment of this composition, said copolymer of structure (D) is one wherein in structure (A-2) wherein $L_2$ is a C-2 to C-4 alkylene moiety.

In another embodiment of this composition, said copolymer of structure (D) is one wherein $R_{III}$ has structure (A-2a).

In another embodiment of this composition, said copolymer of structure (D) is one wherein Rs is a C-1 to C-4 alkyl.

In another embodiment of this composition, said copolymer of structure (D) is one wherein $R_{III}$ has structure (A-2b).

(A-2a)

$$-\!\!\left(CH_2-CH_2-CH_2-Si(ORs)_3\right.$$

(A-2b)

$$-\!\!\left(CH_2-CH_2-CH_2-Si(OCH_3)_3\right.$$

In another embodiment of this composition, said copolymer of structure (D) is one wherein $R_{m3}$ is a C-1 to C-4 alkyl. In another aspect of this embodiment $R_{m3}$ is methyl.

In another embodiment of this composition, said copolymer of structure (D) is one wherein $R_{m3}$ is H.

In another embodiment of this composition, said copolymer of structure (D) is one wherein in the polymer of structure (D), the mole % of the repeat unit of structure (I) ranges from about 70 mole % to about 90 mole %, and the mole % of the repeat unit of structure (III) ranges from about 5 mole % (preferably from about 10 mole %) to about 30 mole %, and further where the total of the mole % of the repeat unit of structures (I), and (III) equal 100 mole %.

In another embodiment of this composition, said copolymer of structure (D) has structure (Db).

(Db)

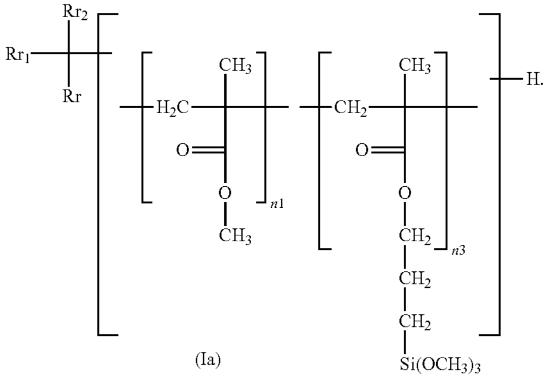

(Ia)

(IIIb)

In another embodiment of this composition, said copolymer of structure (D) or structure (Db) has a Mw ranging from about 15,000 to about 120,000. In another aspect of this embodiment said copolymer has a polydispersity ranging from 1.2 to about 2.5.

In another embodiment of this composition, said copolymer of structure (Db), is one wherein the mole % of the repeat unit of structure (Ia) ranges from about 70 mole % to about 90 mole %, and the mole % of the repeat unit of structure ((IIIb) ranges from about 10 mole % to about 30 mole 00 and further where the total of the mole % of the repeat unit of structures (Ia), and (IIIb) equal 100 mole %.

In another embodiment of this composition, in said crosslinker of structure (B), $L_5$ is a C-4 to C-6 alkylene. In another aspect of this embodiment said crosslinker of structure (B) has structure (B-1).

In another embodiment of this composition, in said crosslinkers of structure (B) or (B-1), $R_{a1}$, $R_{a2}$, $R_{a3}$ and $R_{a4}$ are a C-3 to C-6 alkyl. In another aspect of this embodiment $R_{a1}$, $R_a2$, $R_{a3}$ and $R_{a4}$ are n-butyl.

In yet another aspect of this embodiment said crosslinker has structure (B-1). In still another aspect of this embodiment said crosslinker has structure, (B-2).

(B-1)

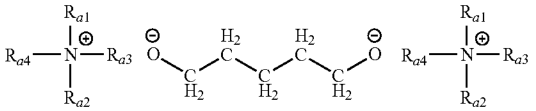

(B-2)

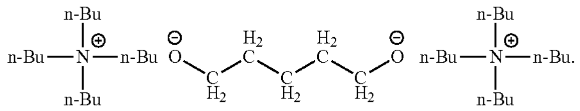

In another embodiment of this composition, it comprises about 0.2 wt. % to about 2.0 wt. % of said copolymer of structure of structure (D) or (Db), about 0.02 wt. % to about 0.04 wt. % of said crosslinker of structure (B), (B-1) or (B-2), and about 98.0 wt. % to about 99.8 wt. % of said spin casting organic solvent, where the sum of these wt. % ranges equals 100 wt. %.

In another embodiment of this composition said crosslinker is one type of crosslinker of structure (B-1). In another embodiment of this composition said crosslinker is at least two different crosslinkers of structure (B-1).

In one embodiment of composition comprising copolymers of structure (D), described herein, these are free of a thermal acid generator, photoacid generator, thermal radical generator or photo-radical generator.

Compositions Comprising a Random Copolymer of Structure (E) and a Spin Casting Organic Solvent Another aspect of this invention is a composition comprising:

A random copolymer of structure (E) comprising:

an alkyl bearing repeat units of structure (I), wherein $R_I$ is a C-1 to C-8 alkyl, $R_{m1}$ is H or a C-1 to C-4 alkyl, and n1 is the total number of repeat units, a repeat unit of structure (IIIc), wherein $R_{m3c}$ is H or a C-1 to C-4 alkyl, $R_{IIIAc}$ is moiety of structure (A-2), wherein $L_2$ is either a direct valence bond or a C-1 to C-10 alkylene moiety, $Rs_1$ is a C-1 to C-4 alkyl, Rs is a C-1 to C-4 alkyl, x is 0, 1 or 2, and n3c is the total number repeat units, a repeat unit of structure (IIId), wherein $R_{m3d}$, is H or a C-1 to C-4 alkyl, $R_{IIIAd}$ is moiety of structure (A-3), wherein $L_3$ is either a direct valence bond or a C-1 to C-10 alkylene moiety, and $R_{ox}$ is an aliphatic moiety comprising an oxirane, and n3d is the total number of repeat units, and two end groups as shown in structure (A) one of which is H and the other is a methyl moiety substituted with Rr, $Rr_1$ and $Rr_2$, wherein $Rr_1$, and $Rr_2$ are independently selected from a C-1 to C-8 alkyl and Rr is a cyano moiety (—CN) or a carbonylalkyl moiety (—C(=O)—Ri), where Ri is a C-1 to C-8 alkyl or an aryl moiety, and;

A spin casting organic solvent.

(E)

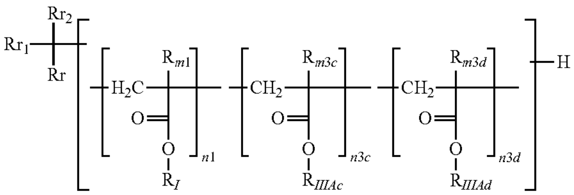

(I) (IIIc) (IIId)

(A-2)

$-\!\!\left(CH_2-L_2-Si(Rs_1)_x(ORs)_{3-x}\right.$ (A-3)

$-\!\!\left(CH_2-L_3-R_{ox}\right.$

In another embodiment of this composition, in said copolymer of structure (E), x is 1. In another aspect of this embodiment x is 2. In yet another aspect of this embodiment x is 0.

In another embodiment of this composition, in said copolymer of structure (E), $L_2$ is a C-2 to C-4 alkylene moiety.

In another embodiment of this composition, in said copolymer of structure (E), $R_{IIIAc}$ has structure (A-2a).

(A-2a)

$-\!\!\left(CH_2-CH_2-CH_2-Si(ORs)_3\right.$

In another embodiment of this composition, in said copolymer of structure (E), Rs is a C-1 to C-4 alkyl.

In another embodiment of this composition, in said copolymer of structure (E), $R_{IIIAc}$ has structure (A-2b).

(A-2b)

$-\!\!\left(CH_2-CH_2-CH_2-Si(OCH_3)_3\right.$

In another embodiment of this composition, in said copolymer of structure (E), $R_{IIIAa}$ has structure (A-3a), wherein $R_e$, $R_{e1}$ and $R_{e2}$ are individually selected from H or a C-1 to C-8 alkyl, and further wherein when $R_{e2}$ and either $R_e$ or $R_{e1}$ are a C-1 to C-4 alkyl groups, $R_{e2}$ and $R_e$, or $R_{e2}$ and $R_{e1}$ may be joined through a C-1 to C-4 alkylene to form a cyclic ring;

In another embodiment of this composition, in said copolymer of structure (E), $R_e$, is a C-1 to C-8 alkyl moiety and Rei, and $R_{e2}$ are H. In another aspect of this embodiment, $R_e$, and $R_{e1}$ is a C-1 to C-8 alkyl moiety and $R_{e2}$ is H. In another aspect of this embodiment, $R_e$, $R_{e1}$ and $R_{e2}$ are individually a C-1 to C-8 alkyl moiety. In yet another aspect of this embodiment, $R_e$, is H and Rei and $R_{e2}$ are individually a C-1 to C-8 alkyl moiety. In still another aspect of this embodiment, $R_e$, is H and $R_{e1}$ is a C-1 to C-8 alkyl moiety and $R_{e2}$ is H.

In another embodiment of this composition, in said copolymer of structure (E), $R_{IIIAa}$ has structure (A-3b), wherein cy is an integer ranging from 1 to 3.

In another embodiment of this composition, in said copolymer of structure (E), wherein $R_{IIIAa}$ has structure (A-3c).

In another embodiment of this composition, in said copolymer of structure (E), $R_{IIIAa}$ has structure (A-3d).

In another embodiment of this composition, in said copolymer of structure (E), $R_{IIIAd}$ has structure (A-3e).

In another embodiment of this composition, in said copolymer of structure (E), $L_3$ is a direct valence bond or a C-1 to C-2 alkylene moiety.

In another embodiment of this composition, in said copolymer of structure (E), $R_{IIIAa}$ has structure (A-3f).

In another embodiment of this composition, in said copolymer of structure (E), $R_{IIIAd}$ has structure (A-3g).

In another embodiment of this composition, in said copolymer of structure (E), $R_{IIIAa}$ has structure (A-3h).

(A-3a)

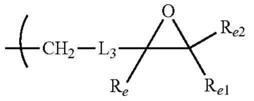

(A-3b)

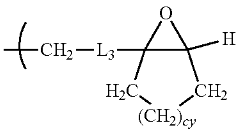

(A-3c)

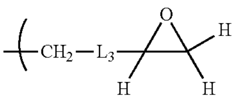

(A-3d)

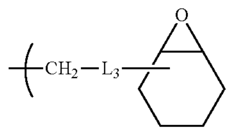

-continued (A-3e)

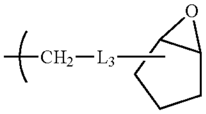

(A-3f)

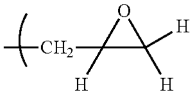

(A-3g)

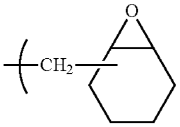

(A-3h)

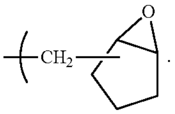

In another embodiment of this composition, in said copolymer of structure (E), $R_I$ is a C-1 to C-4 alkyl. In another aspect of this embodiment $R_I$ is a C-1 to C-3 alkyl. In yet another aspect of this embodiment, $R_I$ is methyl or ethyl. In still another aspect of this embodiment $R_I$ is methyl.

In another embodiment of this composition, in said copolymer of structure (E), $R_I$ is H. In another embodiment of this composition, in said copolymer of structure (E), $R_{m1}$ is H.

In another embodiment of this composition, in said copolymer of structure (E), $R_{m3c}$ is a C-1 to C-4 alkyl. In another aspect of this embodiment $R_{m3c}$ is methyl.

In another embodiment of this composition, in said copolymer of structure (E), $R_{m3c}$ is H.

In another embodiment of this composition, in said copolymer of structure (E), $R_{m3a}$ is a C-1 to C-4 alkyl. In another aspect of this embodiment $R_{m3a}$ is methyl.

In another embodiment of this composition, in said copolymer of structure (E), $R_{m3a}$ is H.

In another embodiment of this composition, in said copolymer of structure (E), $R_{m1}$, $R_{m3c}$ and $R_{m3a}$ are methyl.

In another embodiment of this composition, in said copolymer of structure (E), Rr is a cyano moiety.

In another embodiment of this composition, in said copolymer of structure (E), Rr is a carboxyalkyl moiety. In another aspect of this embodiment Ri is a C-1 to C-8 alkyl. In another aspect of this embodiment Ri is an aryl.

In another embodiment of this composition, in said copolymer of structure (E), $Rr_1$ and $Rr_2$ are independently a C-1 to C-4 alkyl. In another aspect of this embodiment $Rr_1$ and $Rr_2$ are methyl.

In another embodiment of this composition, in said copolymer of structure (E), the repeat unit of structure (I), has structure (Ia).

In another embodiment of this composition, in said copolymer of structure (E), the repeat unit of structure (IIId), has structure (IIIa).

In another embodiment of this composition, in said copolymer of structure (E), the repeat unit of structure (IIIc), have structure (IIIb).

(Ia)

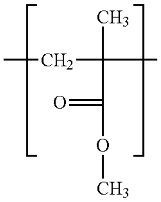

(IIIa)

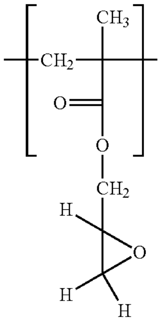

(IIIb)

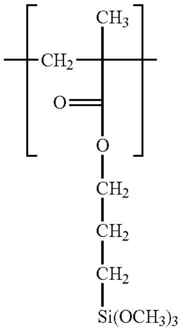

In another embodiment of this composition, in said copolymer of structure (E), based on the total number of moles of repeat units of structures (I), (IIIc) and (IIId), the mole % of the repeat unit of structure (I) ranges from about 70 mole % to about 90 mole %, the mole % of the repeat units of structure (IIIc) ranges from about 5 mole % to about 22 mole % and the repeat units of structure (IIId) ranges from about 5 mole % to about 22 mole %, and further where the total of the mole % of the repeat unit of structures (I), (IIIc), and (IIId) equal 100 mole %.

In another embodiment of this composition, said copolymer of structure (E) has structure (E-1). In one aspect of this embodiment the mole % of the repeat unit of structure (Ia) ranges from about 70 mole % to about 90 mole %, the mole % of the repeat units of structure (IIIb) ranges from about 5 mole % to about 22 mole % and the repeat units of structure (IIIa) ranges from about 5 mole % to about 22 mole %, and further where the total of the mole % of the repeat unit of structures (Ia), (IIIb), and (IIIa) equal 100 mole %.

(E-1)

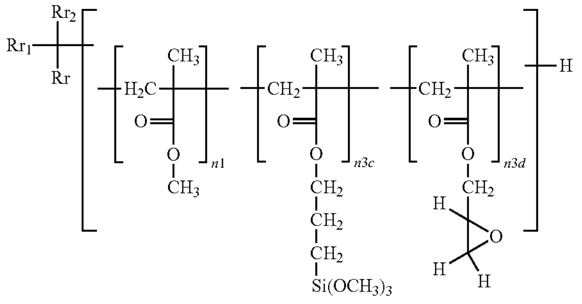

(Ia) (IIIb) (IIIa)

In another embodiment of this composition, said copolymer of structure (E) or said copolymer of structure (E-1), has a Mw ranging from about 15,000 to about 120,000. In another aspect of this embodiment said copolymers have a polydispersity ranging from 1.2 to about 6.

In another embodiment of this composition, it further comprises a single crosslinker of structure (B), or a mixture of at least two different crosslinkers of structure (B), wherein $L_5$ is a C-4 to C-8 alkylene which has a length of at least 4 carbon atoms, and $R_{a1}$, $R_{a2}$, $R_{a3}$ and $R_{a4}$ are independently selected from a C-4 to C-8 alkyl. In one aspect of this embodiment $L_5$ is a C-4 to C-6 alkylene. In another aspect of this embodiment said crosslinker has structure (B-1). In another aspect of said crosslinker $R_{a1}$, $R_{a2}$, $R_{a3}$ and $R_{a4}$ are a C-3 to C-6 alkyl. In still another aspect of this embodiment $R_{a1}$, $R_{a2}$, $R_{a3}$ and $R_{a4}$ are n-butyl.

In another embodiment of this composition where it comprises a single crosslinker this crosslinker has structure (B-1). In one aspect of this embodiment, $R_{a1}$, $R_{a2}$, $R_{a3}$ and $R_{a4}$ are a C-3 to C-6 alkyl. In another aspect of this embodiment $R_{a1}$, $R_{a2}$, $R_{a3}$ and $R_{a4}$ are n-butyl.

In another embodiment of this composition, it is one comprising of about 0.2 wt. % to about 2.0 wt. % of said copolymer, and about 98.0 wt. % to about 99.8 wt. % of said spin casting organic solvent, wherein the sum of these wt. % ranges is 100 wt. % or less.

In another embodiment of this composition, it comprises of about 0.2 wt. % to about 0.5 wt. % of said copolymer, and about 0.02 wt. % to about 0.04 wt. % of said crosslinker, and about 99.5 wt. % to about 99.8 wt. % of said spin casting organic solvent, wherein the sum of these wt. % ranges equals 100 wt. %.

In another embodiment of this composition where it comprises a single crosslinker this crosslinker has structure (B-2), (B)

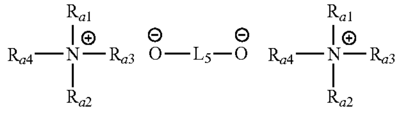

(B-1)

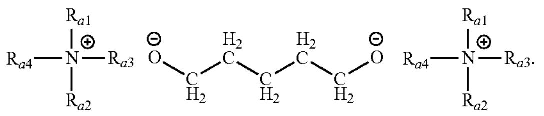

-continued (B-2)

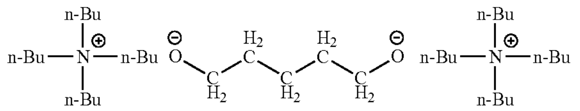

Spin Casting Organic Solvent for Compositions Described Herein

Suitable solvents for use for the inventive composition described herein comprising either copolymers of structure (A), (C), (D) or (E) and their described substructures, are any organic solvent which is employed to spin cast materials such as photoresist, bottom antireflective coatings or other types of organic coatings using the lithographic processing of semiconductor materials. In another aspect of said inventive compositions, the organic spin casting solvent is one which can dissolve said random copolymers and any other additional optional components such as noted herein. This organic spin casting solvent may be a single solvent or a mixture of solvents. Suitable solvents are organic solvent which may include, for example, a glycol ether derivative such as ethyl cellosolve, methyl cellosolve, propylene glycol monomethyl ether (PGME), diethylene glycol monomethyl ether, diethylene glycol monoethyl ether, dipropylene glycol dimethyl ether, propylene glycol n-propyl ether, or diethylene glycol dimethyl ether; a glycol ether ester derivative such as ethyl cellosolve acetate, methyl cellosolve acetate, or propylene glycol monomethyl ether acetate (PGMEA); carboxylates such as ethyl acetate, n-butyl acetate and amyl acetate; carboxylates of di-basic acids such as diethyloxylate and diethylmalonate; dicarboxylates of glycols such as ethylene glycol diacetate and propylene glycol diacetate; and hydroxy carboxylates such as methyl lactate, ethyl lactate (EL), ethyl glycolate, and ethyl-3-hydroxy propionate; a ketone ester such as methyl pyruvate or ethyl pyruvate; an alkyloxycarboxylic acid ester such as methyl 3-methoxypropionate, ethyl 3-ethoxypropionate, ethyl 2-hydroxy-2-methylpropionate, or methylethoxypropionate; a ketone derivative such as methyl ethyl ketone, acetyl acetone, cyclopentanone, cyclohexanone or 2-heptanone; a ketone ether derivative such as diacetone alcohol methyl ether; a ketone alcohol derivative such as acetol or diacetone alcohol; a ketal or acetal like 1,3 dioxalane and diethoxypropane; lactones such as butyrolactone; an amide derivative such as dimethylacetamide or dimethylformamide, anisole, and mixtures thereof.

Process of Using Compositions Comprising Copolymer of Structure (A).

Another aspect of this invention are processes of forming a crosslinked pinning film using any one of the compositions described herein comprising a copolymer of structure (A) which comprise comprising the steps:

i) coating any one of the compositions comprising a copolymer of structure (A), described herein, on a substrate,
ii) baking in air at temperature from about 230 to about 250° C. the coated substrate for about 30 see to about 3 min, to crosslink,
iii) rinsing with a rinse solution for about 1 to about 4 minutes, to remove any soluble material,
iv) drying the coating forming said crosslinked pinning layer on the substrate, Another aspect of this invention are processes for directing a multiplied pattern in a block copolymer film using comprising a copolymer of structure (A), described herein, comprising the steps:

ia) providing a block copolymer having two or more spontaneously separating blocks, iia) providing a substrate, iiia) forming a crosslinked pinning layer according to process steps i) to iv) described above; and, iva) disposing the block copolymer on at least a portion of said crosslinked pinning layer.

In another aspect of this process, it may further comprise the following steps:

va) before disposing the block copolymer, forming a pattern in crosslinked pinning layer by a lithographic process; and, via) optionally providing a second coating in the pattern wherein said second coating is a neutral layer.

Process of Using Compositions Comprising Copolymer of Structure (C).

Another aspect of this invention are processes of forming a crosslinked pinning film using any one of the compositions described herein comprising a copolymer of structure (C) which comprise comprising the steps:

ib) coating any one of the compositions comprising a copolymer of structure (C), described herein, on a substrate, iib) baking in air at temperature from about 230 to about 250° C. the coated substrate for about 30 see to about 3 min, to crosslink, iiib) rinsing with a rinse solution for about 1 to about 4 minutes, to remove any soluble material, ivb) drying the coating forming said crosslinked pinning layer on the substrate, Another aspect of this invention are processes for directing a multiplied pattern in a block copolymer film using comprising a copolymer of structure (C), described herein, comprising the steps:

ic) providing a block copolymer having two or more spontaneously separating blocks;

iic) providing a substrate, iiic) forming a crosslinked pinning layer according as described in steps ib) to ivb); and, ivc) disposing the block copolymer on at least a portion of said crosslinked pinning layer.

In another aspect of this process, it may further comprise the following steps:

vc) before disposing the block copolymer, forming a pattern in crosslinked pinning layer by a lithographic process; and, vic) optionally providing a second coating in the pattern wherein said second coating is a neutral layer.

Process of Using Compositions Comprising Copolymer of Structure (D).

Another aspect of this invention are processes of forming a crosslinked pinning film using any one of the compositions described herein comprising a copolymer of structure (D) which comprise comprising the steps:

id) coating any one of the compositions comprising a copolymer of structure (D), described herein, on a substrate iid) baking in air at temperature from about 230 to about 250° C. the coated substrate for about 30 to about 3 min, to crosslink, iiid) rinsing with a rinse solution for about 1 to about 4 minutes, to remove any soluble material, ivd) drying the coating forming said crosslinked pinning layer on the substrate, Another aspect of this invention are processes for directing a multiplied pattern in a block copolymer film using comprising a copolymer of structure (D), described herein, comprising the steps:

ie) providing a block copolymer having two or more spontaneously separating blocks;

iie) providing a substrate.

iiie) forming a crosslinked pinning layer as described in steps id) to ivd); and, ive) disposing the block copolymer on at least a portion of said crosslinked pinning layer.

In another aspect of this process, it may further comprise the following steps:

ve) before disposing the block copolymer, forming a pattern in crosslinked pinning layer by a lithographic process; and, vie) optionally providing a second coating in the pattern wherein said second coating is a neutral layer.

Process of Using Compositions Comprising Copolymer of Structure (E).

Another aspect of this invention are processes of forming a crosslinked pinning film using any one of the compositions described herein comprising a copolymer of structure (E) which comprise comprising the steps:

if) coating any one of the compositions comprising a copolymer of structure (E), described herein, on a substrate iif) baking in air at temperature from about 230 to about 250° C. the coated substrate for about 30 see to about 3 min, to crosslink, iiif) rinsing with a rinse solution for about 1 to about 4 minutes, to remove any soluble material, ivf) drying the coating forming said crosslinked pinning layer on the substrate, Another aspect of this invention are processes for directing a multiplied pattern in a block copolymer film using comprising a copolymer of structure (E), described herein, comprising the steps:

ig) providing a block copolymer having two or more spontaneously separating blocks;

iig) providing a substrate.

iiig) forming a crosslinked pinning layer as described in steps if) to ivf); and, ivg) disposing the block copolymer on at least a portion of said crosslinked pinning layer.

In another aspect of this process, it may further comprise the following steps:

vg) before disposing the block copolymer, forming a pattern in crosslinked pinning layer by a lithographic process; and, vig) optionally providing a second coating in the pattern wherein said second coating is a neutral layer.

Another aspect of this invention is the use of the copolymer or the composition as described above for forming a crosslinked pinning film on a substrate or for directing a multiplied pattern in a block copolymer film.

EXAMPLES

Chemicals

All chemicals unless otherwise indicated were purchased from Sigma Aldrich (3050 Spruce St., St. Louis, MO 63103).

All synthetic experiments were carried out under $N_2$ atmosphere. Lithographic experiments were carried out as described in the text. The molecular weight of the copolymers was measured with a Gel Permeation Chromatograph.

Gel permeation chromatography equipped with 100 Å, 500 Å, $10^3$ Å, $10^5$ Å and $10^6$ Åμ-ultrastyragel columns Lithographic Experiments were done using a TEL Clean ACT8 track. SEM pictures were taken with an applied Materials NanoSEM_3D Scanning electron microscope picture are shown at either 1 FOV magnification or 2 FOV magnification (Field of view (FOV)=5 μm).

Etching experiments were done using standard isotropic oxygen etching conditions for self-assembled films block copolymer of methyl methacrylate and styrene.

Unless otherwise indicated Molecular weight measurements (a.k.a. $M_n$ polydispersity) were done by Gel permeation chromatography (PSS Inc. Germany) equipped with 100 Å, 500 Å, $10^3$ Å, $10^5$ Å and $10^6$ Å μ-ultrastyragel columns using THF solvent as an eluent. Polystyrene polymer standards were used for calibration.

$^1$H NMR spectra were recorded using Bruker Advanced III 400 MHz spectrometer.

The molecular weight of the copolymers was measured with a Gel Permeation Chromatograph. Chemicals, unless otherwise indicated, were obtained from the Sigma-Aldrich Corporation (St. Louis, Missouri).

Lithographic Experiments were done using a TEL Clean ACT8 track. SEM pictures were taken with an applied Materials NanoSEM_3D Scanning electron microscope picture are shown at either 1 FOV magnification or 2 FOV magnification (Field of view (FOV)=5 m using 1, 2, and 5 FOV).

Etching experiments were done using standard isotropic oxygen etching conditions for self-assembled films block copolymer of methyl methacrylate and styrene.

Unless otherwise indicated Molecular weight measurements (a.k.a. $M_n$ polydispersity) were done by Gel permeation chromatography (PSS Inc. Germany) equipped with 100 Å, 500 Å, $10^3$ Å, $10^5$ Å and $10^6$ Åμ-ultrastyragel columns using THF solvent as an eluent. Polystyrene polymer standards were used for calibration.

Synthesis of Polymeric Materials for Testing

Reference Polymer Synthesis Example Synthesis of P(S-b-MMA) (26k-b-30k)

P(S-b-MMA) (26K-b-30K) was synthesized using the same procedure as described in example 2. To achieve target $M_n$ and compositions of PS and PMMA block, the amount of initiator and monomer quantities were changed. Briefly, 20 g (0.192 moles) of styrene was polymerized with 0.55 mL (1.4M solution) of sec-butyllithium. Then 0.164 g (0.0007 moles) of 1,1'-diphenylethylene (DPE) in 2.5 ml of dry toluene was added via ampule into the reactor. The orange color of the reaction mixture turned into dark brick-red indicating conversion of styryllithium active centers to delocalized DPE adduct carbanion. After 2 min of stirring, a small amount (2 mL) of the reaction mixture was withdrawn for PS block molecular weight analysis. Then methyl methacrylate (22.85 g, 0.23 moles) was added via ampule. The reaction was terminated after 30 min with 1 mL of degassed methanol. The block copolymer was recovered by precipitation in excess isopropanol (5 times of the polymer solution) containing 10% water, filtered, and dried at 55° C. for 12 h under vacuum giving 40 g of P(S-b-MMA) (94% yield) consisting of 46.9 mol. % of polystyrene block and 53.1 mol. % of polymethylmethacrylate block.

Gel permeation chromatography equipped with 100 Å, 500 Å, $10^3$ Å, 10 Å and $10^6$ Åμ-ultrastyragel columns showed that the 1$^{st}$ P(SDPE) block had $M_n$ (GPC)=45,048 g/mol and $M_w$/M=1.04 with respect to PS calibration standards. The diblock copolymer molecular weight obtained from GPC is $Mn_{LPS\text{-}b\text{-}PMMA}$=46,978 g/mol and $M_w/M_n$=1.02.

All chemicals are available from Millipore-Sigma unless otherwise noted. 9-Anthracenemethyl methacrylate is available from Shanghai B&C. NMR was measured by a Bruker 400 MHz Avance III spectrometer. GPC was measured using Agilent system.

Polymer Synthesis Example 1 Synthesis of poly(methyl methacrylate-co-9-anthracenemethyl methacrylate (80/20)

Methyl methacrylate (40.05 g, 0.40 mole), 9-anthracenemethyl methacrylate (27.63 g, 0.10 mole), 2,2'-azobis(2-methylpropionitrile) (6.41 g, 0.03 mole), and anisole (100 g) were added into a flask and degassed via freeze-thaw three times, then charged with a nitrogen atmosphere. The mixture was heated in an 85° C. oil bath for 16 hours. The mixture was diluted with tetrahydrofuran and precipitated in hexane. The supernatant was decanted, and the residue dried in the vacuum oven. The residue was redissolved in THF and precipitated in hexane once again. The supernatant was decanted, and the residue dried in the vacuum oven. The residue was redissolved in THF and precipitated in DI water. The polymer was collected and dried in the vacuum oven. Pale yellow powder, 63.6 g (94.0% yield); 43,532 g/mol Mn, 89,934 g/mol Mw, 2.07 PDI. (82.5/17.5) composition by $^1$H NMR.

Formulation 1:

P(MMA-r-AMMA) (1) was dissolved in ArF-thinner as a 1 wt. % solution. 1,1'-(Methylenedi-4,1-phenylene)bismaleimide was dissolved in ArF-thinner as a 1 wt. % solution. 1 wt. % solution P(MMA-r-AMMA) (9.44 g), 1 wt. % solution 1,1'-(methylenedi-4,1-phenylene)bismaleimide (0.56 g) were mixed and filtered through a 0.2 micron disc filter Formulation 2:

P(MMA-r-AMMA) (1) was dissolved in ArF-thinner as a 1 wt. % solution. 1,1'-(Methylenedi-4,1-phenylene)bismaleimide was dissolved in ArF-thinner as a 1 wt. % solution. 1 wt. % solution P(MMA-r-AMMA) (9.71 g), 1 wt. % solution 1,1'-(methylenedi-4,1-phenylene)bismaleimide (0.29 g) were mixed and filtered through a 0.2 micron disc filter.

Polymer Synthesis Example 2 Synthesis of poly(methyl methacrylate-co-3-(trimethoxysilyl)propyl methacrylate (85/15)

Methyl methacrylate (14.6 g, 0.15 mole), 3-(trimethoxysilyl)propyl methacrylate (9.1 g, 0.04 mole), 2,2'-azobis(2-methylpropionitrile) (0.36 g, 2.2 mmole), and 2-butanone (36 g) were added into a flask and degassed via freeze-thaw three times, then charged with a nitrogen atmosphere. The mixture was heated in a 85° C. oil bath for 16 hours. The mixture was diluted with tetrahydrofuran and precipitated in hexane. The supernatant was decanted, and the residue dried in the vacuum oven. The residue was redissolved in THF and precipitated in hexane once again. The supernatant was decanted, and the residue dried in the vacuum oven. The residue was redissolved in THF and precipitated in DI water. The polymer was collected and dried in the vacuum oven. White powder, 22.3 g (93.8% yield); 16,265 g/mol Mn, 28,481 g/mol Mw, 1.75 PDI. (79.2/20.8) composition by $^1$H NMR.

Formulation 3:

P(MMA-r-TMOSiPrMA) (2) was dissolved in ArF-thinner as a 1 wt. % solution. 1 wt. % solution P(MMA-r-TMSiOSiPrMA) solution (7.81g) and 1 wt. % solution bis(tetrabutylammonium) pentane-1,5-bis(olate) (2.19g) were mixed and filtered through a 0.2 micron disc filter.

Polymer Synthesis Example 3 Synthesis of poly (methyl methacrylate-co-3-(trimethoxysilyl)propyl methacrylate)-co-2-trimethylsilyloxyethyl methacrylate)

Methyl methacrylate (13.8 g, 0.14 mole), 3-(trimethoxysilyl)propyl methacrylate (9.79 g, 0.04 mole), 2-trimethylsilyloxyethyl methacrylate (3.99 g, 0.02 mole), 2,2'-azobis (2-methylpropionitrile) (0.41g, 2.5 mmole), and methyl isobutyl ketone (42g) were added into a flask and degassed via freeze-thaw three times, then charged with a nitrogen atmosphere. The mixture was heated in a 85° C. oil bath for 16 hours. The mixture was diluted with tetrahydrofuran and precipitated in hexane. The supernatant was decanted, and the residue dried in the vacuum oven. The residue was redissolved in THF and precipitated in hexane once again. The supernatant was decanted, and the residue dried in the vacuum oven. The residue was redissolved in THF and precipitated in DI water. The polymer was collected and dried in the vacuum oven. White powder, 26.2 g (94.3% yield); 17,799 g/mol Mn, 34,024 g/mol Mw, 1.91 PDI. (69.8/20.7/9.5) composition by 1H NMR.

Polymer Synthesis Example 4 Synthesis of poly (methyl methacrylate-co-3-(trimethoxysilyl)propyl methacrylate)-co-glycidyl methacrylate)]

Methyl methacrylate (14.4 g, 0.14 mole), 3-(trimethoxysilyl)propyl methacrylate (10.2 g, 0.04 mole), glycidyl methacrylate (2.9 g, 0.02 mole), 2,2'-azobis(2-methylpropionitrile) (0.41g, 2.5 mmol), and methyl isobutyl ketone (42 g) were added into a flask and degassed via freeze-thaw three times, then charged with a nitrogen atmosphere. The mixture was heated in an 85° C. oil bath for 16 hours. The mixture was diluted with tetrahydrofuran and precipitated in hexane. The supernatant was decanted, and the residue dried in the vacuum oven. The residue was redissolved in THF and precipitated in hexane once again. The supernatant was decanted, and the residue dried in the vacuum oven. The residue was redissolved in THF and precipitated in DI water. The polymer was collected and dried in the vacuum oven. White powder, 26.8 g (96.5% yield); 19,113 g/mol Mn, 95,995 g/mol Mw, 5.02 PDI.

Scheme 1 shows a general reaction scheme for making the polymers of Polymer Synthetic Examples 6 and 7.

Scheme 1

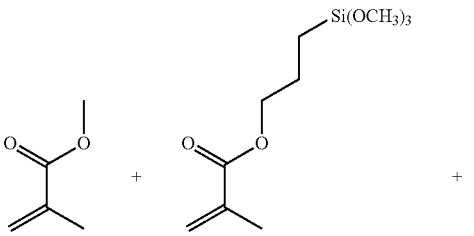

-continued

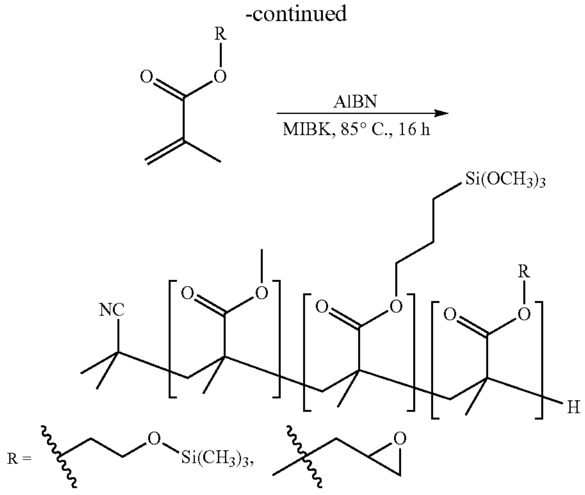

FIG. 1 shows a representative 1H NMR spectra for P(MMA-r-TMOSiPrMA-r-TMSHEMA)

Synthesis of (TBA)2-PD: bis(tetrabutylammonium) pentane-1,5-bis(olate)

1 wt. % solution bis(tetrabutylammonium) pentane-1,5-bis(olate) was made as by mixing 1,5-pentanediol (0.10 g, 1.0 mmole), tetrabutylammonium hydroxide (1.54 g, 1.9 mmole), and ArF-thinner (55 g).

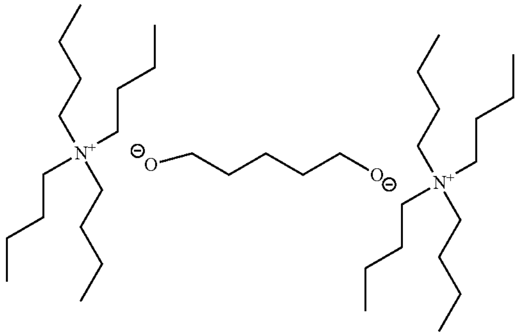 [SMILES: CCCC[N+](CCCC)(CCCC)CCCC ; [O-]CCCCC[O-] ; CCCC[N+](CCCC)(CCCC)CCCC]

Characterization

Table 1 shows the composition of the formulations tested, these formulations were prepared by dissolving the denoted polymer and crosslinkers in ArF thinner (PGMEA:PGME 70:30), to form a 0.4 or 1 wt. % solution. The wt. % indicated for the crosslinker, if present is with respect to the combined solid weight of the solution. After dissolution the samples were filtered through a 0.2 micron disc filter.

TABLE 1

| Formulation | Polymer | Crosslinker wt. % |
|---|---|---|
| 1 | (PMMA-r-AMMA) (80/20) | 0.5 MPBM |
| 2 | (PMMA-r-AMMA) (80/20) | 0.25 MPBM |
| 3 | P(MMA-r-TMOSiPrMA) (85/15) | 0.2 (TBA)2-PD |
| 4 | P(MMA-r-TMOSiPrMA-r-TMS-HEMA) (70/20/10) | none |
| 5 | P(MMA-r-TMOSiPrMA-r-GMA) (70/20/10) | none |

MPBM: 1,1'-(methylenedi-4,1-phenylene)bismaleimide (1,1'-(methylenebis(4,1-phenylene))bis(1H-pyrrole-2,5-dione) was obtained from Sigma-Aldrich.

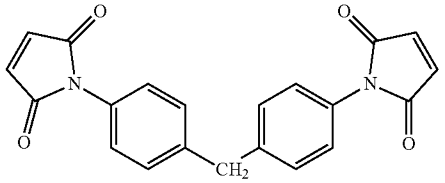 [SMILES: O=C1C=CC(=O)N1c1ccc(Cc2ccc(N3C(=O)C=CC3=O)cc2)cc1]

Soak Testing of Formulations

Table 2 shows the result of soak test done on crosslinked film made with the compositions. These soak tests indicated all these formulations had acceptable crosslinking to be used as a polar directing MAT.

TABLE 2

| Sample | FT(nm) | σ(Å) | FT(nm) | σ(Å) |
|---|---|---|---|---|
| | Before rinse (230° C./2 min/air) | | After rinse | |
| Formulation 1 | 14.23 | 0.55 | 14.19 | 0.43 |
| Formulation 2 | 14.31 | 0.53 | 14.19 | 0.84 |
| Formulation 3 | 11.21 | 0.82 | 11.23 | 0.62 |
| | Before rinse (250° C./2 min/air) | | After rinse | |
| Formulation 1 | 13.83 | 0.61 | 13.9 | 0.75 |
| Formulation 2 | 13.94 | 0.65 | 13.67 | 0.66 |
| Formulation 3 | 11.14 | 0.99 | 11.14 | 0.95 |
| | Before rinse (240° C./2 min/air) | | After rinse | |
| Formulation 4 | 7.1 | 0.32 | 6.9 | 0.27 |
| Formulation 5 | 6.6 | 0.47 | 6.5 | 0.33 |

Soak Testing of Formulations

Block Copolymer Formulation

The Reference Polymer Synthesis Example was dissolved in ArF thinner to form a 0.4 wt. % solution which was filtered with 0.2 μm PTFE.

FIG. 2 shows a SEM image showing parallel morphology for PME-7102 (Lo=29 nm, film thickness is 35 nm at 1500 rpm) and annealed at 250° C. for 2 minutes in air on a crosslinked film of the material of Synthesis Example 2 on a silicon wafer. The resultant absence of fingerprint pattern indicates that the underlying MAT layer has cause the overlying block copolymer to pin by interacting with the polar methyl methacrylate of the overlying block copolymer.

The invention claimed is:

1. A composition comprising:

a random copolymer having structure (D), comprising:

an alkyl bearing repeat units of structure (I), wherein RI is a C-1 to C-8 alkyl, $R_{m1}$ is H or a C-1 to C-4 alkyl, and n1 is the total number of repeat units, a crosslinking repeat unit of structure (III), wherein $R_{m3}$ is H or a C-1 to C-4 alkyl, in which $R_{III}$ is either a moiety of structure (A-2), wherein $Rs_1$ is a C-1 to C-4 alkyl, Rs is a C-1 to C-4 alkyl, x is 0, 1 or 2, and $L_2$ is either a direct valence bond or a C-1 to C-10 alkylene moiety and n3 is the total number of repeat units, two end groups as shown in structure (D), one of which is H and the other is a methyl moiety substituted with Rr, $Rr_1$ and $Rr_2$, wherein $Rr_1$, and $Rr_2$ are independently selected from a C-1 to C-8 alkyl and Rr is a cyano moiety (—CN) or a carbonylalkyl moiety (—C(=O)—Ri), where Ri is a C-1 to C-8 alkyl or an aryl moiety;

at least one crosslinker of structure (B), wherein;

$L_5$ is a C-4 to C-8 alkylene which has a length of at least 4 carbon atoms, $R_{a1}$, $R_{a2}$, $R_{a3}$ and $R_{a4}$ are independently selected from a C-4 to C-8 alkyl; and a spin casting organic solvent;

(D)

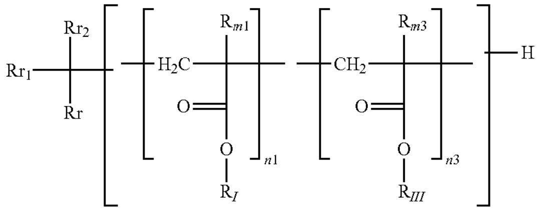

(I) (III)

(A-2)

$$-\!\!\leftarrow CH_2-L_2-Si(Rs_1)x(ORs)_{3-x}$$

(B)

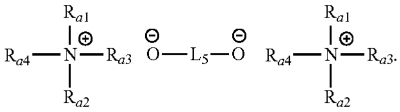

2. The composition of claim 1, wherein said copolymer of structure (D) consist essentially of repeat units of structures (I), and (III).

3. The composition of claim 1, wherein said copolymer of structure (D) consist of repeat units of structures (I), and (III).

4. The composition of claim 1, wherein $R_{m1}$ is methyl.

5. The composition of claim 1, wherein $R_{m1}$ is H.

6. The composition of claim 1, wherein in structure (A-2) x is 1.

7. The composition of claim 1, wherein in structure (A-2) x is 2.

8. The composition of claim 1, wherein in structure (A-2) x is 0.

9. The composition of claim 1, wherein $L_2$ is a C-2 to C-4 alkylene moiety.

10. The composition of claim 1, wherein Rm has structure (A-2a);

(A-2a)

$$-\!\!\leftarrow CH_2-CH_2-CH_2-Si(ORs)_3.$$

11. The composition of claim 1, wherein Rm has structure (A-2b)

(A-2b)

$$-\!\!\leftarrow CH_2-CH_2-CH_2-Si(OCH_3)_3.$$

12. The composition of claim 1, wherein $R_{m3}$ is methyl.

13. The composition of claim 1, wherein $R_{m3}$ is H.

14. The composition of claim 1, wherein, in the polymer of structure (D), the mole % of the repeat unit of structure (I) ranges from about 70 mole % to about 90 mole %, and the mole % of the repeat unit of structure (III) ranges from about 5 mole % to about 30 mole %, and further where the total of the mole % of the repeat unit of structures (I), and (III) equal 100 mole %.

15. The composition of claim 1, wherein in said crosslinker of structure (B), $L_5$ is a C-4 to C-6 alkylene.

16. The composition of claim 1, wherein said crosslinker of structure (B) has structure (B-1), (B-1)

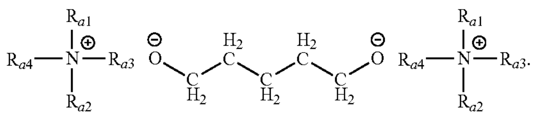

17. The composition of claim 1, comprising about 0.2 wt. % to about 2.0 wt. % of said copolymer, about 0.02 wt. % to about 0.04 wt. % of said crosslinker, and about 98.0 wt. % to about 99.8 wt. % of said spin casting organic solvent, wherein the sum of these wt. % ranges equals 100 wt. %.

18. A process of forming a crosslinked pinning film comprising the steps:

id) coating the composition of claim 1 on a substrate, iid) baking in air at temperature from about 230 to about 250° C. the coated substrate for about 30 sec to about 3 min, to crosslink, iiid) rinsing with a rinse solution for about 1 to about 4 minutes, to remove any soluble material, ivd) drying the coating forming said crosslinked pinning layer on the substrate.

19. A process for directing a multiplied pattern in a block copolymer film, said process comprising:

ie) providing a block copolymer having two or more spontaneously separating blocks, iie) providing a substrate, iiie) forming a crosslinked pinning layer according to claim 18; and, ive) disposing the block copolymer on at least a portion of said crosslinked pinning layer.

20. The process of claim 19 further comprising:

ve) before disposing the block copolymer, forming a pattern in crosslinked pinning layer by a lithographic process, vie) optionally providing a second coating in the pattern wherein said second coating is a neutral layer.

* * * * *